(12) United States Patent
Hamblin et al.

(10) Patent No.: US 7,999,795 B2
(45) Date of Patent: Aug. 16, 2011

(54) DOUBLE-SIDED TOUCH SENSITIVE PANEL AND FLEX CIRCUIT BONDING

(75) Inventors: Mark Arthur Hamblin, San Francisco, CA (US); Steve Porter Hotelling, Los Gatos, CA (US)

(73) Assignee: Apple Inc., Cupertino, CA (US)

( * ) Notice: Subject to any disclaimer, the term of this patent is extended or adjusted under 35 U.S.C. 154(b) by 0 days.

(21) Appl. No.: 12/985,239

(22) Filed: Jan. 5, 2011

(65) Prior Publication Data
US 2011/0094993 A1 Apr. 28, 2011

Related U.S. Application Data

(62) Division of application No. 11/650,049, filed on Jan. 3, 2007.

(51) Int. Cl.
*G09G 5/00* (2006.01)
(52) U.S. Cl. ........ 345/173; 345/174; 345/175; 345/178; 178/18.01; 178/18.06
(58) Field of Classification Search .......... 345/173–179; 178/18.01–18.06
See application file for complete search history.

(56) References Cited

U.S. PATENT DOCUMENTS

| | | |
|---|---|---|
| 5,483,261 A | 1/1996 | Yasutake |
| 5,488,204 A | 1/1996 | Mead et al. |
| 5,825,352 A | 10/1998 | Bisset et al. |
| 5,835,079 A | 11/1998 | Shieh |
| 5,880,411 A | 3/1999 | Gillespie et al. |
| 5,942,733 A | 8/1999 | Allen et al. |
| 5,971,250 A | 10/1999 | Safabakhsh et al. |
| 6,046,886 A | 4/2000 | Himes et al. |
| 6,188,391 B1 | 2/2001 | Seely et al. |
| 6,310,610 B1 | 10/2001 | Beaton et al. |
| 6,320,691 B1 | 11/2001 | Ouchi et al. |

(Continued)

FOREIGN PATENT DOCUMENTS
JP 2000-163031 A 6/2000
(Continued)

OTHER PUBLICATIONS

Lee, S.K. et al. (Apr. 1985). "A Multi-Touch Three Dimensional Touch-Sensitive Tablet," *Proceedings of CHI: ACM Conference on Human Factors in Computing Systems*, pp. 21-25.

(Continued)

*Primary Examiner* — Quan-Zhen Wang
*Assistant Examiner* — Jennifer Nguyen
(74) *Attorney, Agent, or Firm* — Morrison & Foerster LLP

(57) ABSTRACT

A multi-touch sensor panel can be created using a substrate with column and row traces formed on either side. Metal traces running along the border of the substrate can be used to bring the row traces to the same edge as the column traces. A single flex circuit can be fabricated to connect to the rows and columns on directly opposing sides. Flex printed circuits can be bonded to directly opposing attachment areas of a substrate by cooling one side of the substrate while bonding the other. In addition, "coverlay" material extending over right-angled traces on the flex circuit ensure that those traces do not get shorted should conductive bonding material get squeezed out during bonding. Furthermore, a spacer is placed at the distal end of the flex circuit to apply even bonding pressure over the entire flex circuit attachment area during bonding.

4 Claims, 29 Drawing Sheets

U.S. PATENT DOCUMENTS

| | | | |
|---|---|---|---|
| 6,323,846 | B1 | 11/2001 | Westerman et al. |
| 6,450,026 | B1 * | 9/2002 | Desarnaud ................. 73/335.04 |
| 6,562,659 | B1 | 5/2003 | Izumi et al. |
| 6,690,361 | B1 | 2/2004 | Kang et al. |
| 6,690,387 | B2 | 2/2004 | Zimmerman et al. |
| 7,015,894 | B2 | 3/2006 | Morohoshi |
| 7,184,064 | B2 | 2/2007 | Zimmerman et al. |
| 7,663,607 | B2 | 2/2010 | Hotelling et al. |
| 7,724,243 | B2 | 5/2010 | Geaghan |
| 2003/0234770 | A1 * | 12/2003 | MacKey ....................... 345/173 |
| 2005/0083307 | A1 * | 4/2005 | Aufderheide et al. ........ 345/173 |
| 2005/0099402 | A1 | 5/2005 | Nakanishi et al. |
| 2005/0205980 | A1 * | 9/2005 | Manansala ................... 257/680 |
| 2005/0260338 | A1 * | 11/2005 | Chien ......................... 427/96.1 |
| 2006/0026521 | A1 | 2/2006 | Hotelling et al. |
| 2006/0097991 | A1 | 5/2006 | Hotelling et al. |
| 2006/0197753 | A1 | 9/2006 | Hotelling |
| 2006/0274055 | A1 | 12/2006 | Reynolds et al. |
| 2008/0158181 | A1 | 7/2008 | Hamblin et al. |
| 2011/0094098 | A1 | 4/2011 | Hamblin et al. |

FOREIGN PATENT DOCUMENTS

JP            2002-342033 A    11/2002

OTHER PUBLICATIONS

Rubine, D.H. (Dec. 1991). "The Automatic Recognition of Gestures," CMU-CS-91-202, Submitted in Partial Fulfillment of the Requirements for the Degree of Doctor of Philosophy in Computer Science at Carnegie Mellon University, 285 pages.

Rubine, D.H. (May 1992). "Combining Gestures and Direct Manipulation," CHI '92, pp. 659-660.

Westerman, W. (Spring 1999). "Hand Tracking, Finger Identification, and Chordic Manipulation on a Multi-Touch Surface," A Dissertation Submitted to the Faculty of the University of Delaware in Partial Fulfillment of the Requirements for the Degree of Doctor of Philosophy in Electrical Engineering, 364 pages.

Non-Final Office Action mailed Mar. 2, 2011, for U.S. Appl. No. 11/650,049, filed Jan. 3, 2007, six pages.

Non-Final Office Action mailed Mar. 8, 2011, for U.S. Appl. No. 12/985,230, filed Jan. 5, 2011, seven pages.

* cited by examiner

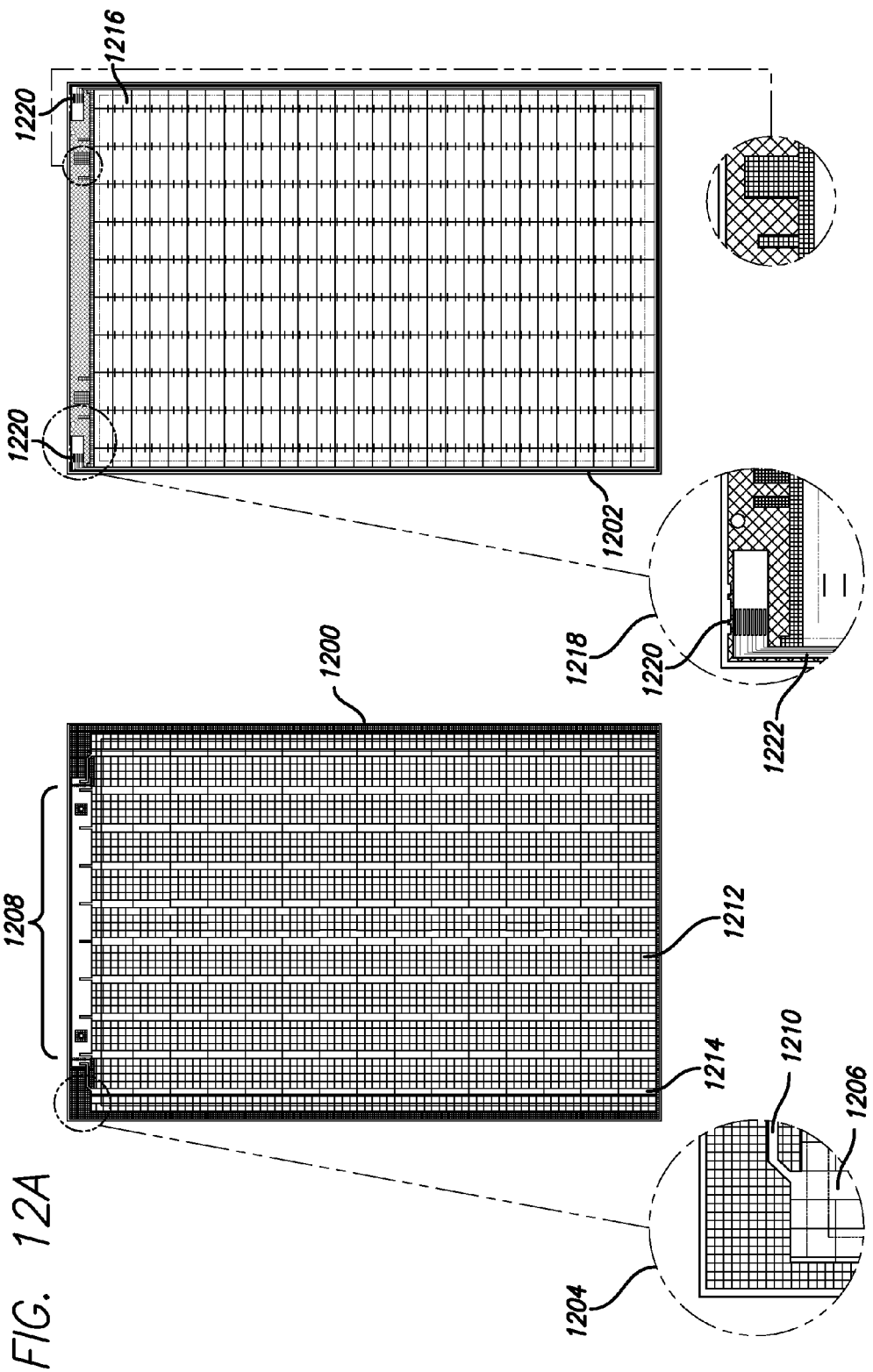

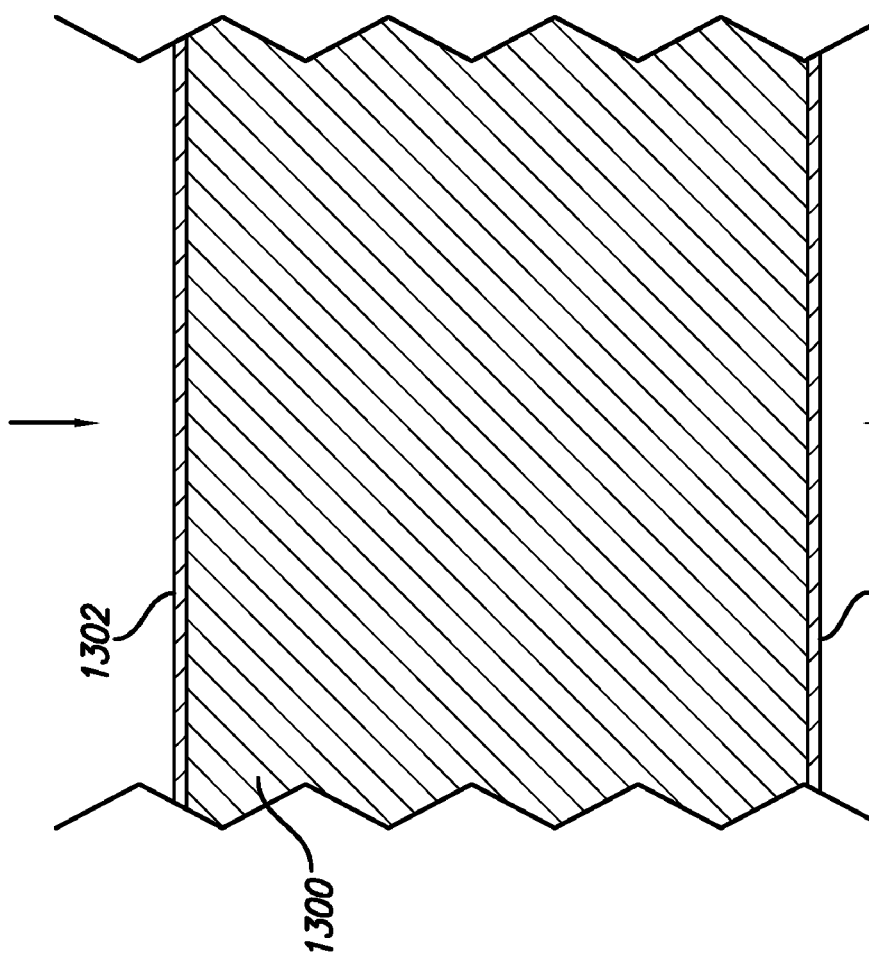

DOUBLE-SIDED TOUCH SENSITIVE PANEL AND FLEX CIRCUIT BONDING

CROSS-REFERENCE TO RELATED APPLICATIONS

This application is a divisional of U.S. patent application Ser. No. 11/650,049, filed Jan. 3, 2007, the entire disclosure of which is incorporated herein by reference.

FIELD OF THE INVENTION

This invention relates to the bonding of flexible circuits to substrates, and more particularly, to the bonding of flex circuits to directly opposing attachment areas of a substrate, and an improved flex circuit design for enabling more secure and less error-prone bonding.

BACKGROUND OF THE INVENTION

Many types of input devices are presently available for performing operations in a computing system, such as buttons or keys, mice, trackballs, touch panels, joysticks, touch screens and the like. Touch screens, in particular, are becoming increasingly popular because of their ease and versatility of operation as well as their declining price. Touch screens can include a touch panel, which can be a clear panel with a touch-sensitive surface. The touch panel can be positioned in front of a display screen so that the touch-sensitive surface covers the viewable area of the display screen. Touch screens can allow a user to make selections and move a cursor by simply touching the display screen via a finger or stylus. In general, the touch screen can recognize the touch and position of the touch on the display screen, and the computing system can interpret the touch and thereafter perform an action based on the touch event.

Touch panels can include an array of touch sensors capable of detecting touch events (the touching of fingers or other objects upon a touch-sensitive surface). Future panels may be able to detect multiple touches (the touching of fingers or other objects upon a touch-sensitive surface at distinct locations at about the same time) and near touches (fingers or other objects within the near-field detection capabilities of their touch sensors), and identify and track their locations. Examples of multi-touch panels are described in Applicant's co-pending U.S. application Ser. No. 10/842,862 entitled "Multipoint Touchscreen," filed on May 6, 2004 and published as U.S. Published Application No. 2006/0097991 on May 11, 2006, the contents of which are incorporated by reference herein.

Capacitive touch sensor panels can be formed from rows and columns of traces on opposite sides of a dielectric. At the "intersections" of the traces, where the traces pass above and below each other (but do not make direct electrical contact with each other), the traces essentially form two electrodes. Conventional touch panels for use over display devices have typically utilized a top layer of glass upon which transparent column traces of indium tin oxide (ITO) or antimony tin oxide (ATO) have been etched, and a bottom layer of glass upon which row traces of ITO have been etched. However, the use of transparent traces is not required if the conductors are thin enough (on the order of 30 microns). In addition, if panel transparency is not required (e.g. the touch panel is not being used over a display device), the conductors can be made out of an opaque material such as copper. The top and bottom glass layers are separated by a clear polymer spacer that acts as a dielectric between the row and column traces. The traces on both the top and bottom glass layers can have a spacing of about 5 mm.

To scan a sensor panel, a stimulus can be applied to one row with all other rows held at DC voltage levels. When a row is stimulated, a modulated output signal can be capacitively coupled onto the columns of the sensor panel. The columns can be connected to analog channels (also referred to herein as event detection and demodulation circuits). For every row that is stimulated, each analog channel connected to a column generates an output value representative of an amount of change in the modulated output signal due to a touch or hover event occurring at the sensor located at the intersection of the stimulated row and the connected column. After analog channel output values are obtained for every column in the sensor panel, a new row is stimulated (with all other rows once again held at DC voltage levels), and additional analog channel output values are obtained. When all rows have been stimulated and analog channel output values have been obtained, the sensor panel is said to have been "scanned," and a complete "image" of touch or hover can be obtained over the entire sensor panel. This image of touch or hover can include an analog channel output value for every pixel (row and column) in the panel, each output value representative of the amount of touch or hover that was detected at that particular location.

Because the rows must be either stimulated with an AC signal or held at a DC voltage level, and because the columns must be connected to analog channels so that modulated output signals can be detected, demodulated and converted to output values, electrical connections must be formed with the rows and columns on either side of the dielectric of the sensor panel. Because the rows and columns are perpendicular to each other, the most straightforward way to connect to these rows and columns is to bond a flex circuit at one edge of the sensor panel (e.g. the shorter side of a rectangular panel) to provide connections to the columns, and bond another flex circuit on an adjacent edge of the sensor panel (e.g. the longer side of a rectangular panel) to provide connections to the rows. However, because these flex circuit connections areas are not on the same edge of the sensor panel and are not on directly opposing sides of the dielectric, the sensor panel must be made larger to accommodate these two non-overlapping connection areas.

Because it is desirable to keep the overall size of the sensor panel as small as possible, it would be preferable to have two flex circuits connect to directly opposing sides of the sensor panel. By doing so, the extra attachment area that would be created by non-overlapping areas on either side of the sensor panel can be eliminated, and the area on the sensor panel reserved for the sensor array can be maximized.

However, bonding flex circuits on directly opposing sides of a dielectric is difficult to accomplish because of the heat and pressure applied by a bonding to bond flex circuits. The heat cures the epoxy, and the pressure causes the electrical connections to be formed. However, this heat and pressure can delaminate a previously bonded flex circuit on the other side of the dielectric. The pressure from bonding can also lead to conductive bonding material squeezing out onto exposed circuit traces on the flex circuits, causing shorts between circuit traces. In addition, due to the flexible nature of flex circuits, flex circuits have historically had problems with the cracking of traces within the flex circuits, causing open circuits.

SUMMARY OF THE INVENTION

A multi-touch sensor panel can be created using a substrate with column and row traces formed on either side of the substrate using a novel fabrication process. Traces made of copper or other highly conductive metals running along the edge of the substrate can be used to bring the row traces to the same edge of the substrate as the column traces so that flex circuits can be bonded to the same edge of the substrate on directly opposing sides of the substrate, minimizing the area needed for connectivity and reducing the overall size of the sensor panel.

Column and row ITO traces can be formed on both sides of a DITO substrate using several fabrication methods. In one embodiment, a substrate can be placed on the rollers of the fabrication machinery and a layer of ITO can be sputtered onto a first side of the DITO substrate and etched (e.g. using photolithography techniques) to form the column traces. A protective coating of photoresist (e.g. two layers of photoresist) can then be applied over the column traces, and the DITO substrate can be flipped over so that the rollers make contact only with the applied photoresist on the first side and not the formed column traces. Another layer of ITO can then be sputtered onto the now-exposed back side of the DITO substrate and etched to form row traces.

If no metal traces are required, the photoresist on the first side can be stripped off to complete the process. However, if metal traces are required at the edges to connect to the row traces and bring them to a particular edge of the substrate, a protective coating of photoresist (e.g. two layers of photoresist) can be applied over the row traces, leaving the edges exposed. A metal layer can then be sputtered over the photoresist and exposed edges, and the metal layer can then be etched to form metal traces at the edges. Finally, all remaining layers of photoresist can be stripped off.

A single flex circuit can be fabricated to connect to the rows and columns on directly opposing sides at the same edge of the substrate. Flex circuit portions on the single flex circuit can be formed for connecting to the row and column traces, respectively, on either side of a DITO substrate, and to a host processor. The flex circuit can also include a circuit area upon which a multi-touch subsystem, multi-touch panel processor, high voltage driver and decoder circuitry, an EEPROM and some essential small components such as bypass capacitors can be mounted and connected to save space.

Flex circuit portions can be bonded to directly opposing attachment areas of a substrate, forming both structural and electrical connections. This bonding can be performed by cooling a previously bonded flex circuit and attachment area on one side of the substrate while bonding another flex circuit to the attachment area on the other side of the substrate. In particular, a bonding head can press down on a topside flex circuit portion and apply both pressure and heat to the topside flex circuit portion, the bonding material and a substrate attachment area. At substantially the same time, a cooling head can make contact with a previously bonded backside flex circuit portion and substrate attachment area to cool those areas. The cooling head can cool the backside flex circuit portion and substrate attachment area by acting as a heatsink.

This bonding can also be performed by arranging the conductors on the two directly opposing attachment areas so that the conductors on opposite sides do not directly overlap each other. Shaped bonding heads can then be used to apply heat and pressure to only those regions of the attachment area having conductors, so that heat and pressure are never applied on the directly opposing surface of a previously formed bond. In particular, directly opposing substrate attachment areas can have their conductors staggered and arranged so that the conductors on opposite sides do not directly overlap each other. This arrangement does not increase the total substrate area needed because a certain minimum attachment area is needed for flex circuit attachment, and there is enough space within this minimum attachment area to allow for non-overlapping conductor areas on the top and bottom. With this conductor arrangement, bonding heat and pressure need only be applied in non-overlapping areas. A topside bonding head, specially shaped to apply heat and pressure only on those areas of the substrate attachment area containing conductors, can press down on the topside flex circuit portion, the bonding material and the substrate attachment area. Simultaneously or at a different time, a backside bonding head, specially shaped to apply heat and pressure only on those areas of the substrate attachment area containing conductors, can press down on the backside flex circuit portion, the bonding material and the substrate attachment area.

In addition, the attachment areas of the flex circuits themselves can be coated with a "coverlay" material extending over right-angled traces on the flex circuit to ensure that those traces do not get shorted should anisotropic conductive film (ACF) bonding material get squeezed out from between the flex circuit and the attachment area on the substrate during bonding. Furthermore, a spacer is placed at the distal end of the flex circuit to enable a larger bonding head to apply even bonding pressure over the entire flex circuit attachment area during bonding. In particular, the spacer can be affixed to a distal end of the flex circuit portion at a location such that the spacer and coverlay are not directly opposing each other on opposite sides of the flex circuit portion. The spacer forces the distal end of the flex circuit portion down to substrate so that it can be bonded.

BRIEF DESCRIPTION OF THE DRAWINGS

FIG. 12a illustrates a top side and a bottom side of an exemplary DITO substrate according to one embodiment of this invention.

FIGS. 13a-13j and 13l-13r illustrate an exemplary process for forming patterned conductive material on both sides of a single substrate according to one embodiment of this invention.

DETAILED DESCRIPTION OF THE PREFERRED EMBODIMENT

In the following description of preferred embodiments, reference is made to the accompanying drawings which form a part hereof, and in which it is shown by way of illustration specific embodiments in which the invention may be practiced. It is to be understood that other embodiments may be utilized and structural changes may be made without departing from the scope of the preferred embodiments of the present invention.

Figure 1:
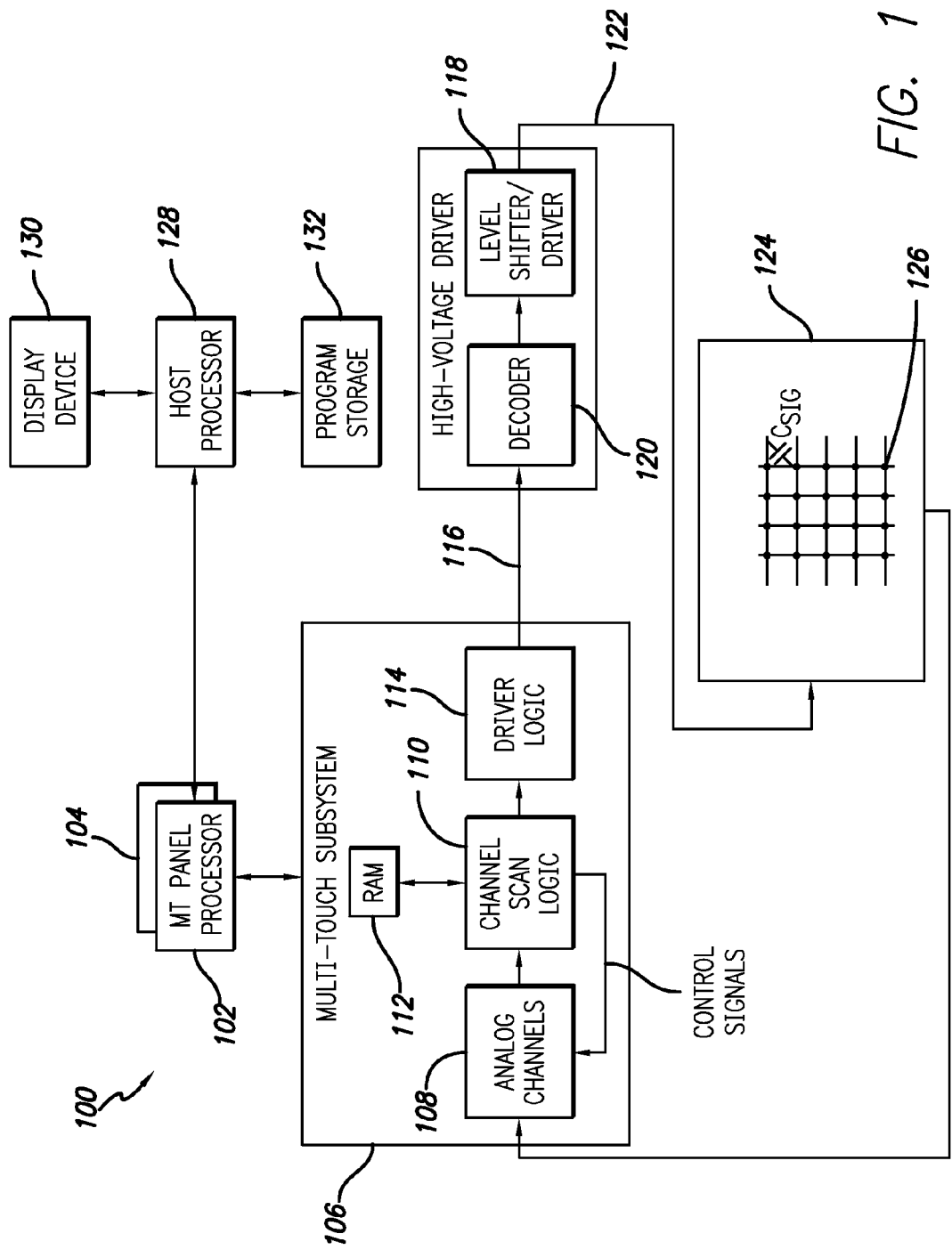
FIG. 1 illustrates exemplary computing system operable with multi-touch panel and flex circuits according to one embodiment of this invention.

Multi-touch sensor panels and their associated sensor panel circuitry may be able to detect multiple touches (touch events or contact points) that occur at about the same time, and identify and track their locations. FIG. 1 illustrates exemplary computing system 100 operable with capacitive multi-touch sensor panel 124 according to embodiments of this invention. Multi-touch sensor panel 124 can be created using a substrate with column and row traces formed on either side of the substrate using a novel fabrication process. Flex circuits can be used to connect the column and row traces on either side of the sensor panel to its associated sensor panel circuitry. Traces made of copper or other highly conductive metals running along the edge of the substrate can be used to bring the row traces to the same edge of the substrate as the column traces so that the flex circuits can be bonded to the same edge of the substrate on directly opposing sides of the substrate, minimizing the area needed for connectivity and reducing the overall size of the sensor panel. A single flex circuit can be fabricated to connect to the rows and columns on directly opposing sides at the same edge of the substrate.

Flex printed circuits can be bonded to directly opposing attachment areas of a substrate, forming both structural and electrical connections. This bonding can be performed by cooling a previously bonded flex circuit and attachment area on one side of the substrate while bonding another flex circuit to the attachment area on the other side of the substrate. In other embodiments, this bonding can be performed by arranging the conductors on the two directly opposing attachment areas so that the conductors on opposite sides do not directly overlap each other. Shaped bonding heads can then be used to apply heat and pressure to only those regions of the attachment area having conductors, so that heat and pressure are never applied on the directly opposing surface of a previously formed bond.

In addition, a flex circuit attachment area includes "coverlay" material extending over right-angled traces on the flex circuit to ensure that those traces do not get shorted should anisotropic conductive film (ACF) bonding material get squeezed out from between the flex circuit and the attachment area on the substrate during bonding. Furthermore, a spacer is placed at the distal end of the flex circuit to enable a larger bonding head to apply even bonding pressure over the entire flex circuit attachment area during bonding.

Although embodiments of this invention may be described herein in terms of touch sensor panels having flex circuit attachment areas on directly opposing surfaces, it should be understood that embodiments of this invention are not limited to two-sided touch sensor panels, but are generally applicable to any double-sided substrate having flex circuit attachment areas on directly opposing surfaces.

Computing system 100 can include one or more panel processors 102 and peripherals 104, and panel subsystem 106. The one or more processors 102 can include, for example, an ARM968 processors or other processors with similar functionality and capabilities. However, in other embodiments, the panel processor functionality can be implemented instead by dedicated logic such as a state machine. Peripherals 104 can include, but are not limited to, random access memory (RAM) or other types of memory or storage, watchdog timers and the like.

Panel subsystem 106 can include, but is not limited to, one or more analog channels 108, channel scan logic 110 and driver logic 114. Channel scan logic 110 can access RAM 112, autonomously read data from the analog channels and provide control for the analog channels. This control can include multiplexing columns of multi-touch panel 124 to analog channels 108. In addition, channel scan logic 110 can control the driver logic and stimulation signals being selectively applied to rows of multi-touch panel 124. In some embodiments, panel subsystem 106, panel processor 102 and peripherals 104 can be integrated into a single application specific integrated circuit (ASIC).

Driver logic 114 can provide multiple panel subsystem outputs 116 and can present a proprietary interface that drives high voltage driver 118. High voltage driver 118 can provide level shifting from a low voltage level (e.g. complementary metal oxide semiconductor (CMOS) levels) to a higher voltage level, providing a better signal-to-noise (S/N) ratio for noise reduction purposes. The high voltage driver outputs can be sent to decoder 120, which can selectively connect one or more high voltage driver outputs to one or more panel row inputs 122 through a proprietary interface and enable the use of fewer high voltage driver circuits in the high voltage driver 118. Each panel row input 122 can drive one or more rows in a multi-touch panel 124. In some embodiments, high voltage driver 118 and decoder 120 can be integrated into a single ASIC. However, in other embodiments high voltage driver 118 and decoder 120 can be integrated into driver logic 114, and in still other embodiments high voltage driver 118 and decoder 120 can be eliminated entirely.

Computing system 100 can also include host processor 128 for receiving outputs from panel processor 102 and performing actions based on the outputs that can include, but are not limited to, moving an object such as a cursor or pointer, scrolling or panning, adjusting control settings, opening a file or document, viewing a menu, making a selection, executing instructions, operating a peripheral device connected to the host device, answering a telephone call, placing a telephone call, terminating a telephone call, changing the volume or audio settings, storing information related to telephone communications such as addresses, frequently dialed numbers, received calls, missed calls, logging onto a computer or a computer network, permitting authorized individuals access to restricted areas of the computer or computer network, loading a user profile associated with a user's preferred arrangement of the computer desktop, permitting access to web content, launching a particular program, encrypting or decoding a message, and/or the like. Host processor 128 can also perform additional functions that may not be related to panel processing, and can be coupled to program storage 132 and display device 130 such as a liquid crystal display (LCD) for providing a UI to a user of the device.

Multi-touch panel 124 can in some embodiments include a capacitive sensing medium having a plurality of row traces or driving lines and a plurality of column traces or sensing lines, although other sensing media may also be used. The row and column traces can be formed from a transparent conductive medium such as Indium Tin Oxide (ITO) or Antimony Tin Oxide (ATO), although other transparent and non-transparent materials such as copper can also be used. In some embodiments, the row and column traces can be formed on opposite sides of a dielectric material, and can be perpendicular to each other, although in other embodiments other non-orthogonal orientations are possible. For example, in a polar coordinate system, the sensing lines can be concentric circles and the driving lines can be radially extending lines (or vice versa). It should be understood, therefore, that the terms "row" and "column," "first dimension" and "second dimension," or "first axis" and "second axis" as used herein are intended to encompass not only orthogonal grids, but the intersecting traces of other geometric configurations having first and second dimensions (e.g. the concentric and radial lines of a polar-coordinate arrangement). It should also be noted that in other embodiments, the rows and columns can be formed on a single side of a substrate, or can be formed on two separate substrates separated by a dielectric material. In some embodiments, the dielectric material can be transparent, such as glass, or can be formed from other materials, such as mylar. An additional dielectric cover layer may be placed over the row or column traces to strengthen the structure and protect the entire assembly from damage.

At the "intersections" of the traces, where the traces pass above and below (cross) each other (but do not make direct electrical contact with each other), the traces essentially form two electrodes (although more than two traces could intersect as well). Each intersection of row and column traces can represent a capacitive sensing node and can be viewed as a picture element (pixel) 126, which can be particularly useful when multi-touch panel 124 is viewed as capturing an "image" of touch. (In other words, after multi-touch subsystem 106 has determined whether a touch event has been detected at each touch sensor in the multi-touch panel, the pattern of touch sensors in the multi-touch panel at which a touch event occurred can be viewed as an "image" of touch (e.g. a pattern of fingers touching the panel).) The capacitance between row and column electrodes appears as a stray capacitance on all columns when the given row is held at DC and as a mutual capacitance Csig when the given row is stimulated with an AC signal. The presence of a finger or other object near or on the multi-touch panel can be detected by measuring changes to Csig. The columns of multi-touch panel 124 can drive one or more analog channels 108 (also referred to herein as event detection and demodulation circuits) in multi-touch subsystem 106. In some embodiments, each column is coupled to one dedicated analog channel 108. However, in other embodiments, the columns may be couplable via an analog switch to a fewer number of analog channels 108.

Figure 2A:
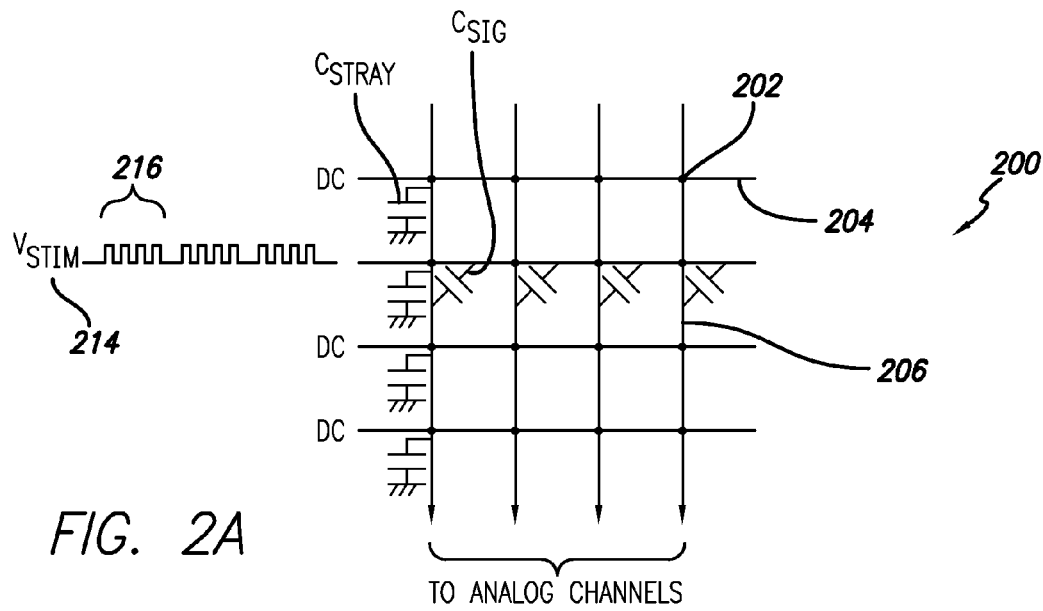
FIG. 2a illustrates an exemplary capacitive multi-touch panel according to one embodiment of this invention.

FIG. 2a illustrates exemplary capacitive multi-touch panel 200. FIG. 2a indicates the presence of a stray capacitance Cstray at each pixel 202 located at the intersection of a row 204 and a column 206 trace (although Cstray for only one column is illustrated in FIG. 2 for purposes of simplifying the figure). Note that although FIG. 2a illustrates rows 204 and columns 206 as being substantially perpendicular, they need not be so aligned, as described above. In the example of FIG. 2a, AC stimulus Vstim 214 is being applied to one row, with all other rows connected to DC. The stimulus causes a charge to be injected into the column electrodes through mutual capacitance at the intersecting points. This charge is Qsig=Csig×Vstm. Each of columns 206 may be selectively connectable to one or more analog channels (see analog channels 108 in FIG. 1).

Figure 2B:
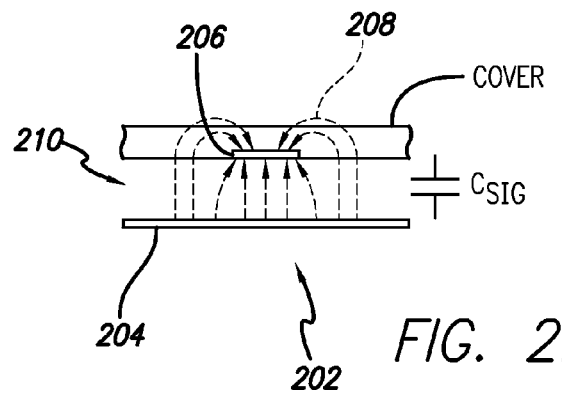
FIG. 2b is a side view of an exemplary pixel in a steady-state (no-touch) condition according to one embodiment of this invention.

FIG. 2b is a side view of exemplary pixel 202 in a steady-state (no-touch) condition. In FIG. 2b, an electric field of electric field lines 208 of the mutual capacitance between column 206 and row 204 traces or electrodes separated by dielectric 210 is shown.

Figure 2C:
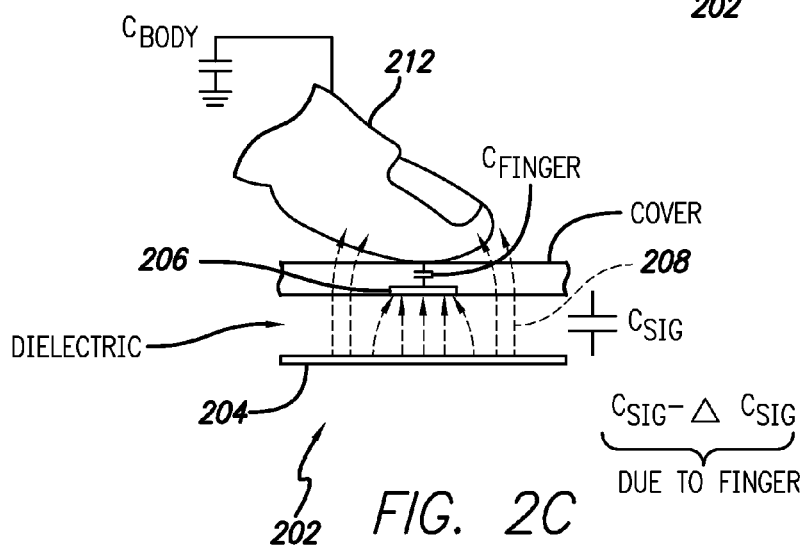
FIG. 2c is a side view of an exemplary pixel in a dynamic (touch) condition according to one embodiment of this invention.

FIG. 2c is a side view of exemplary pixel 202 in a dynamic (touch) condition. In FIG. 2c, finger 212 has been placed near pixel 202. Finger 212 is a low-impedance object at signal frequencies, and has an AC capacitance Cfinger from the column trace 204 to the body. The body has a self-capacitance to ground Cbody of about 200 pF, where Cbody is much larger than Cfinger. If finger 212 blocks some electric field lines 208 between the row and column electrodes (those fringing fields that exit the dielectric and pass through the air above the row electrode), those electric field lines are shunted to ground through the capacitance path inherent in the finger and the body, and as a result, the steady state signal capacitance Csig is reduced by ΔCsig. In other words, the combined body and finger capacitance act to reduce Csig by an amount ΔCsig (which can also be referred to herein as Csig_sense), and can act as a shunt or dynamic return path to ground, blocking some of the electric fields as resulting in a reduced net signal capacitance. The signal capacitance at the pixel becomes Csig−ΔCsig, where Csig represents the static (no touch) component and ΔCsig represents the dynamic (touch) component. Note that Csig−ΔCsig may always be nonzero due to the inability of a finger, palm or other object to block all electric fields, especially those electric fields that remain entirely within the dielectric material. In addition, it should be understood that as a finger is pushed harder or more completely onto the multi-touch panel, the finger can tend to flatten, blocking more and more of the electric fields, and thus ΔCsig can be variable and representative of how completely the finger is pushing down on the panel (i.e. a range from "no-touch" to "full-touch").

Referring again to FIG. 2a, as mentioned above, Vstim signal 214 can be applied to a row in multi-touch panel 200 so that a change in signal capacitance can be detected when a finger, palm or other object is present. Vstim signal 214 can include one or more pulse trains 216 at a particular frequency, with each pulse train including a number of pulses. Although pulse trains 216 are shown as square waves, other waveshapes such as sine waves can also be employed. A plurality of pulse trains 216 at different frequencies can be transmitted for noise reduction purposes to detect and avoid noisy frequencies. Vstim signal 214 essentially injects a charge into the row, and can be applied to one row of multi-touch panel 200 at a time while all other rows are held at a DC level. However, in other embodiments, the multi-touch panel may be divided into two or more sections, with Vstim signal 214 being simultaneously applied to one row in each section and all other rows in that region section held at a DC voltage.

Each analog channel coupled to a column measures the mutual capacitance formed between that column and the row. This mutual capacitance is comprised of the signal capacitance Csig and any change Csig_sense in that signal capacitance due to the presence of a finger, palm or other body part or object. These column values provided by the analog channels may be provided in parallel while a single row is being stimulated, or may be provided in series. If all of the values representing the signal capacitances for the columns have been obtained, another row in multi-touch panel 200 can be stimulated with all others held at a DC voltage, and the column signal capacitance measurements can be repeated. Eventually, if Vstim has been applied to all rows, and the signal capacitance values for all columns in all rows have been captured (i.e. the entire multi-touch panel 200 has been "scanned"), a "snapshot" of all pixel values can be obtained for the entire multi-touch panel 200. This snapshot data can be initially saved in the multi-touch subsystem, and later transferred out for interpretation by other devices in the computing system such as the host processor. As multiple snapshots are obtained, saved and interpreted by the computing system, it is possible for multiple touches to be detected, tracked, and used to perform other functions.

Figure 3:
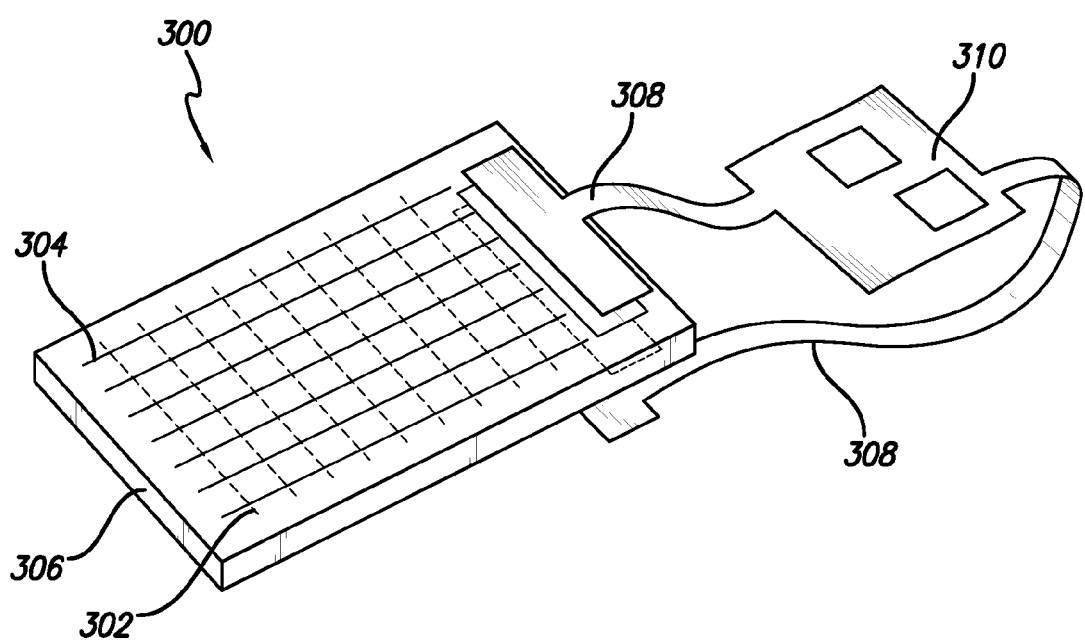
FIG. 3 is a perspective view of an exemplary sensor panel with rows and columns on opposite sides of substrate according to one embodiment of this invention.

As the above description makes clear, when the rows and columns of a sensor panel are on opposite sides of a dielectric, it is necessary to transmit electrical signals to the rows in the form of a stimulus of DC signal, and receive modulated output signals from the columns. FIG. 3 is a perspective view of exemplary sensor panel 300 with rows 302 and columns 304 on opposite sides of substrate 306 according to one embodiment of this invention. In the example of FIG. 3, Indium Tin Oxide (ITO) and metal traces are present on both the top and bottom sides of dielectric substrate 306. It would be desirable for flex circuits (a.k.a. flexible printed circuits (FPCs)) 308 to be bonded to both sides of the dielectric, on directly opposing sides (as illustrated in FIG. 3), to provide electrical connections to PCB 310. Such bonding can help minimize the size of sensor panel 300, because no extra area is needed for non-overlapping bonding areas, and the area reserved for attachments can be minimized. Bonding flex circuits 308 as shown in FIG. 3 also minimizes trace length differences, which can minimize unwanted differences in the modulated output signals appearing on columns 304 if the sensor panel relies on capacitive coupling.

Figure 4A:
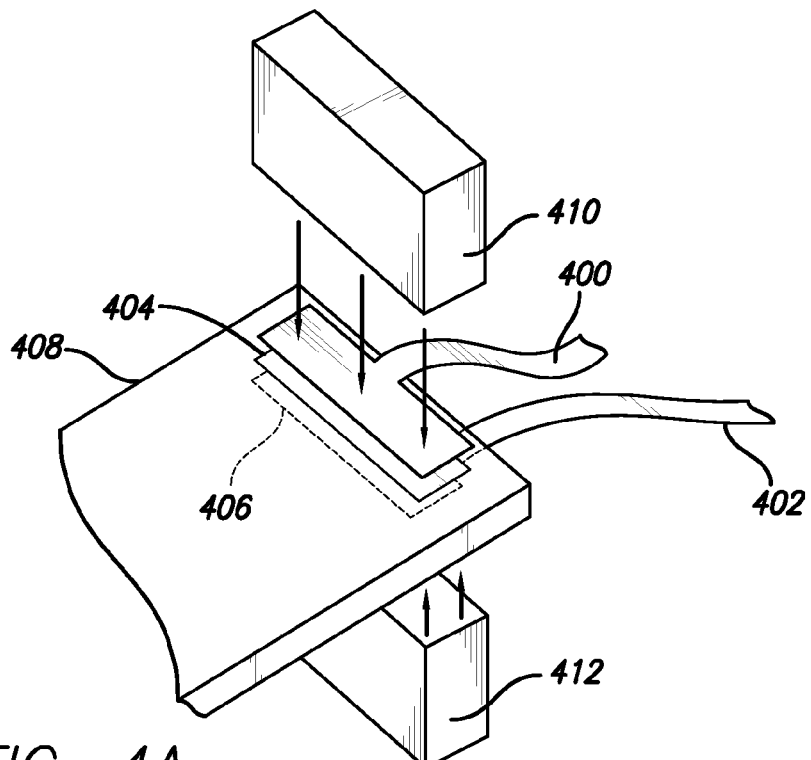
FIG. 4a illustrates the exemplary bonding of a flex circuit portion while cooling the flex circuit portion of a directly opposing substrate attachment area of a substrate according to one embodiment of this invention.

FIG. 4a illustrates the exemplary bonding of two flex circuit portions 400 and 402 on directly opposing substrate attachment areas 404 and 406 of substrate 408 according to some embodiments of this invention. In FIG. 4a, backside flex circuit portion 402 has been previously bonded to substrate attachment area 406. Bonding head 410 now presses down on topside flex circuit portion 400 and applies both pressure and heat to topside flex circuit portion 400 and the bonding material between the topside flex circuit portion and substrate attachment area 404. However, prior to or substantially simultaneous with the application of heat and pressure by bonding head 410, cooling head 412 can make contact with previously bonded backside flex circuit portion 402 and substrate attachment area 406 to cool those areas. During this contact, cooling head 412 can cool backside flex circuit portion 402 and substrate attachment area 406 by acting as a heatsink. Cooling head 412 can operate as a heatsink by flowing a coolant through the head, providing a large enough mass of thermally conductive material, blowing air over backside flex portion 402, or other cooling means.

Figure 4B:
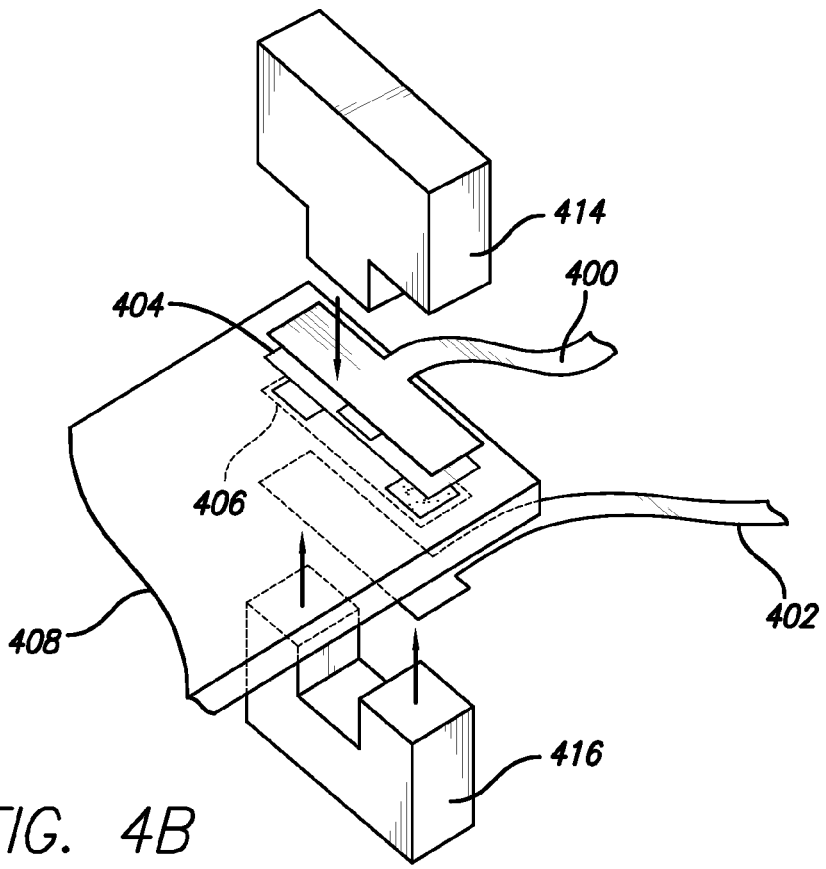
FIG. 4b illustrates the exemplary bonding of two flex circuit portions on directly opposing substrate attachment areas of a substrate using special bonding heads according to one embodiment of this invention.

FIG. 4b illustrates the exemplary bonding of two flex circuit portions 400 and 402 on directly opposing substrate attachment areas 404 and 406 of substrate 408 according to other embodiments of this invention. In FIG. 4b, substrate attachment areas 404 and 406 have their conductors staggered and arranged so that the conductors on opposite sides do not directly overlap each other. For example, the conductors on substrate attachment area 404 can be centrally located, while the conductors on substrate attachment area 406 can be on the outer areas. This arrangement does not increase the total substrate area needed because a certain minimum attachment area is needed for flex circuit attachment, and there is enough space within this minimum attachment area to allow for non-overlapping conductor areas on the top and bottom.

With this conductor arrangement, bonding heat and pressure need only be applied in non-overlapping areas. Topside bonding head 414, specially shaped to apply heat and pressure only on those areas of substrate attachment area 404 containing conductors, can press down on topside flex circuit portion 400 and the bonding material between the topside flex circuit portion and substrate attachment area 404. Simultaneously or at a different time, backside bonding head 416, specially shaped to apply heat and pressure only on those areas of substrate attachment area 406 containing conductors, can press down on backside flex circuit portion 402 and the bonding material between the backside flex circuit portion and substrate attachment area 404. The selected bonding areas of FIG. 4b allow for sufficient mechanical attachment while minimizing substrate area and providing good electrical quality bonds only in certain areas. It should be understood that the shapes and dimensions of bonding heads 414 and 416 in FIGS. 4a and 4b are exemplary only.

Figure 5A:
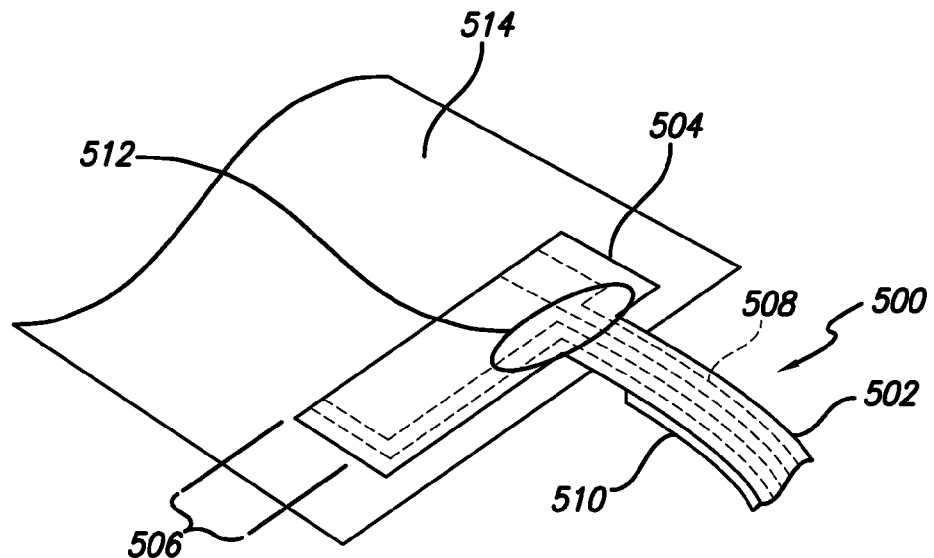
FIG. 5a is a perspective view of an exemplary conventional flex circuit portion.

FIG. 5a is a perspective view of exemplary conventional flex circuit portion 500. Flex circuit portion 500 includes ribbon area 502 and flex circuit attachment area 504 having underside bonding area 506 for bonding to substrate 514. Traces 508 can be printed on the underside of flex circuit portion 500, with coverlay 510 applied over the traces to protect the traces. Because traces 508 must be routed to different areas on flex circuit attachment area 504, right angled areas 512 having traces routed with right-angled bends can be present in flex circuit portion 500.

Figure 5B:
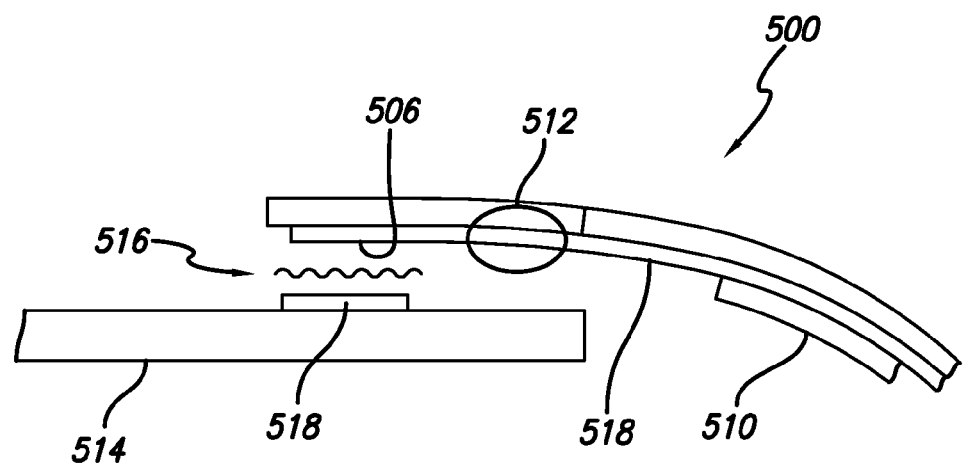
FIG. 5b is a cross-sectional view of the attachment of a conventional exemplary flex circuit portion to a substrate.

FIG. 5b is a cross-sectional view of the attachment of exemplary flex circuit portion 500 to substrate 514. Because flex circuit portion 500 is flexible, when it is unsupported by substrate 514 exposed traces 520 not covered by coverlay 510 can crack, causing open circuits. In FIG. 5b, ACF bonding material 516 is compressed between bonding area 506 and conductors 518 on substrate 514. However, as mentioned above, if ACF bonding material 516 is squeezed out during the bonding process, it can flow over right angled areas 512 and cause shorts between those traces.

In particular, these shorts are caused by the squeezing out of the conductive spheres present in ACF during bonding. ACF is a conductive film adhesive (a thermoset epoxy) comprised of conductive spheres (polymers coated with nickel and gold plate). During bonding, the film is squeezed from 25 to 3 microns in the z-direction only, and as a result the conductive spheres are flattened until they make contact with each other and also the traces to be connected on both the flex circuit and substrate, forming an electrical connection between the traces on the flex circuit and substrate. Because the spheres are not squeezed as much in the areas without traces, they do not make contact with each other and therefore do not create a short between adjacent traces. However, as the ACF adhesive is compressed, it can flow out sideways, and may flow over exposed areas where right angled traces are present. The conductive spheres can dam up against the right-angled traces, causing shorts between the right-angled traces.

Figure 6A:
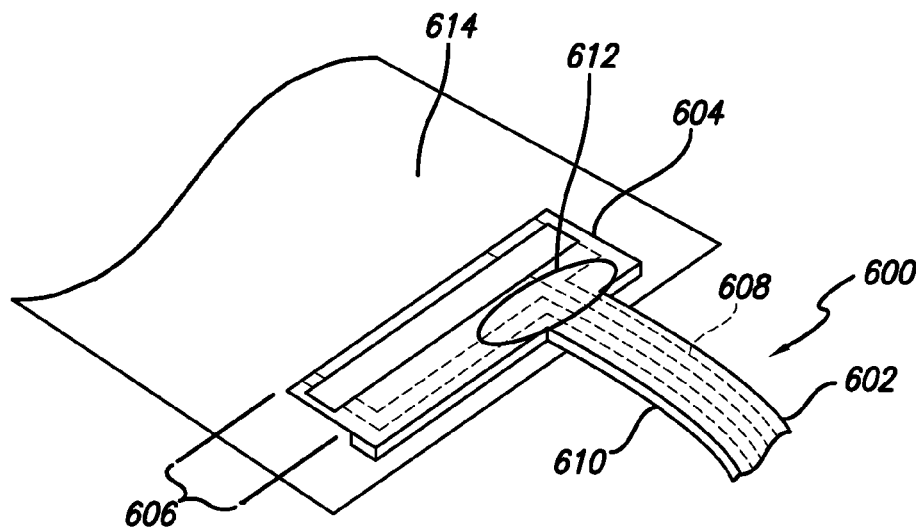
FIG. 6a is a perspective view of exemplary flex circuit portion according to one embodiment of this invention.

FIG. 6a is a perspective view of exemplary flex circuit portion 600 according to some embodiments of this invention. Flex circuit portion 600 includes ribbon area 602 and flex circuit attachment area 604 having underside bonding area 606 for bonding to substrate 614. Traces 608 can be printed on the underside of flex circuit portion 600, with coverlay 610 applied over the traces to protect the traces. Because traces 608 must be routed to different areas on flex circuit attachment area 604, right angled areas 612 having traces routed with right-angled bends (or other bends or corners of any angle) can be present in flex circuit portion 600. Note that coverlay 610 extends over right-angled areas 612. In addition, spacer 620 is affixed to the distal end of flex circuit portion 600, at a location such that the spacer and coverlay 610 are not directly opposing each other on opposite sides of the flex circuit portion. Spacer 620 forces the distal end of flex circuit portion 600 down to substrate so that it can be bonded.

Figure 6B:
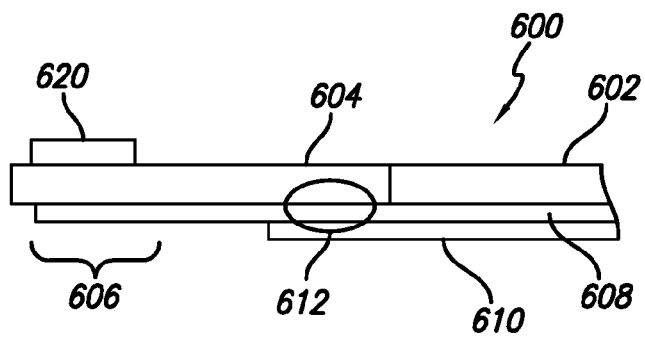
FIG. 6b is a cross-sectional view of an exemplary flex circuit portion in an unbonded state showing ribbon area, flex circuit attachment area, underside bonding area, traces, right-angled areas, coverlay extending over the angled areas, and a spacer according to one embodiment of this invention.

FIG. 6b is a cross-sectional view of exemplary flex circuit portion 600 in an unbonded state according to some embodiments of this invention, showing ribbon area 602, flex circuit attachment area 604, underside bonding area 606, traces 608, right-angled areas 612, coverlay 610 extending over the right-angled areas, and spacer 620.

Figure 6C:
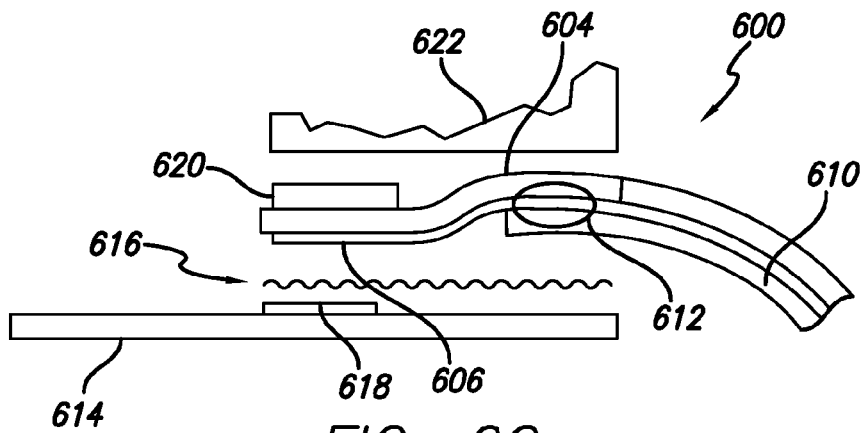
FIG. 6c is a cross-sectional view of the attachment of exemplary flex circuit portion to a substrate according to one embodiment of this invention.

FIG. 6c is a cross-sectional view of the attachment of exemplary flex circuit portion 600 to substrate 614 according to some embodiments of this invention. In FIG. 6c, spacer 620 pushes the distal end of attachment area 604 down to substrate 614, and enables bonding head 622 to span a large portion of flex circuit attachment area 604 and bond a larger portion of flex circuit portion 600, so that no traces remain unexposed and hanging off substrate 614, making them less likely to crack. The larger bonding area also provides a higher reliability bond. ACF bonding material 616 is compressed between underside bonding area 606 and conductors 618 on substrate 614, and along most of the flex circuit attachment area 604. With the embodiment of FIG. 6c, if ACF bonding material 616 is squeezed out during the bonding process, it cannot flow over angled areas 612 and cause shorts between those traces, because those areas are now covered by coverlay 610. The embodiment of FIG. 6c can be used in either of the bonding processes shown in FIGS. 4a and 4b.

Figure 7A:
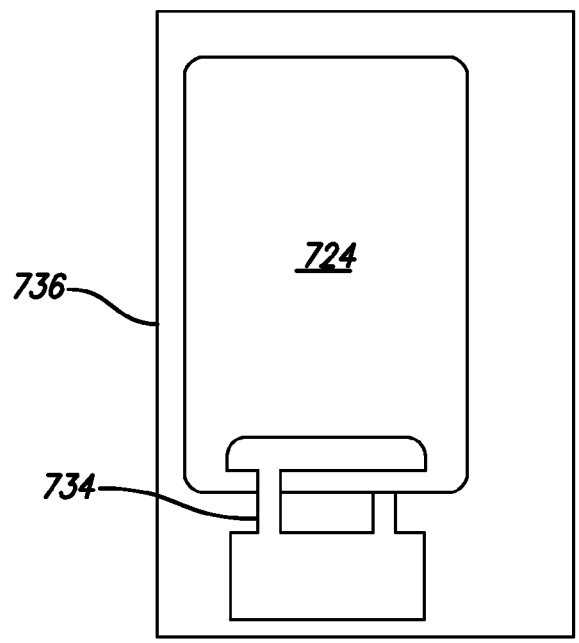
FIG. 7a illustrates an exemplary mobile telephone that can include a touch sensor panel and a flex circuit formed and bonded according to one embodiment of this invention.
Figure 7B:
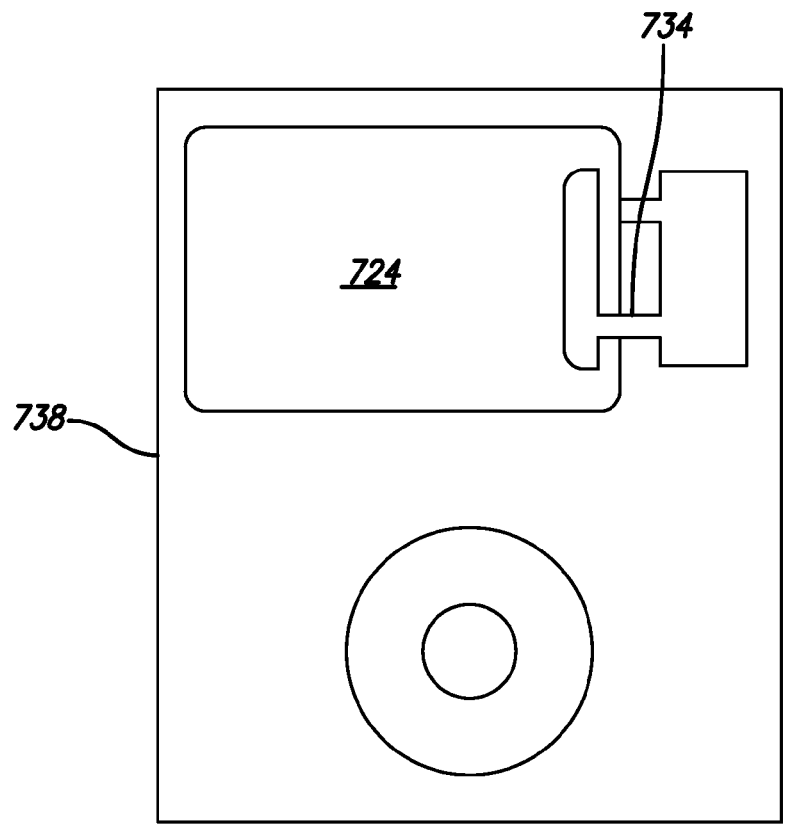
FIG. 7b illustrates an exemplary digital audio/video player that can include a touch sensor panel and a flex circuit formed and bonded according to one embodiment of this invention.

FIG. 7a illustrates an exemplary mobile telephone 736 that can include touch sensor panel 724 and flex circuit 734 formed and bonded as described above according to embodiments of this invention. FIG. 7b illustrates an exemplary digital audio/video player 738 that can include touch sensor panel 724 and flex circuit 734 formed and bonded as described above according to embodiments of this invention. The mobile telephone and digital audio/video player of FIGS. 7a and 7b can advantageously benefit from having its touch sensor panel and flex circuits bonded as described above to keep the overall size of the sensor panel to a minimum (which can be a very important marketability factor in consumer electronics) and maximize the number of sensors that can fit on a given sensor panel. Furthermore, the mobile telephone and digital audio/video player of FIGS. 7a and 7b can advantageously benefit from having its flex circuits formed and bonded as described above to provide a better structural bond, reduce cracking and open circuits in traces in the flex circuit, and reduce shorts between right-angled traces in the flex circuit.

Figure 8:
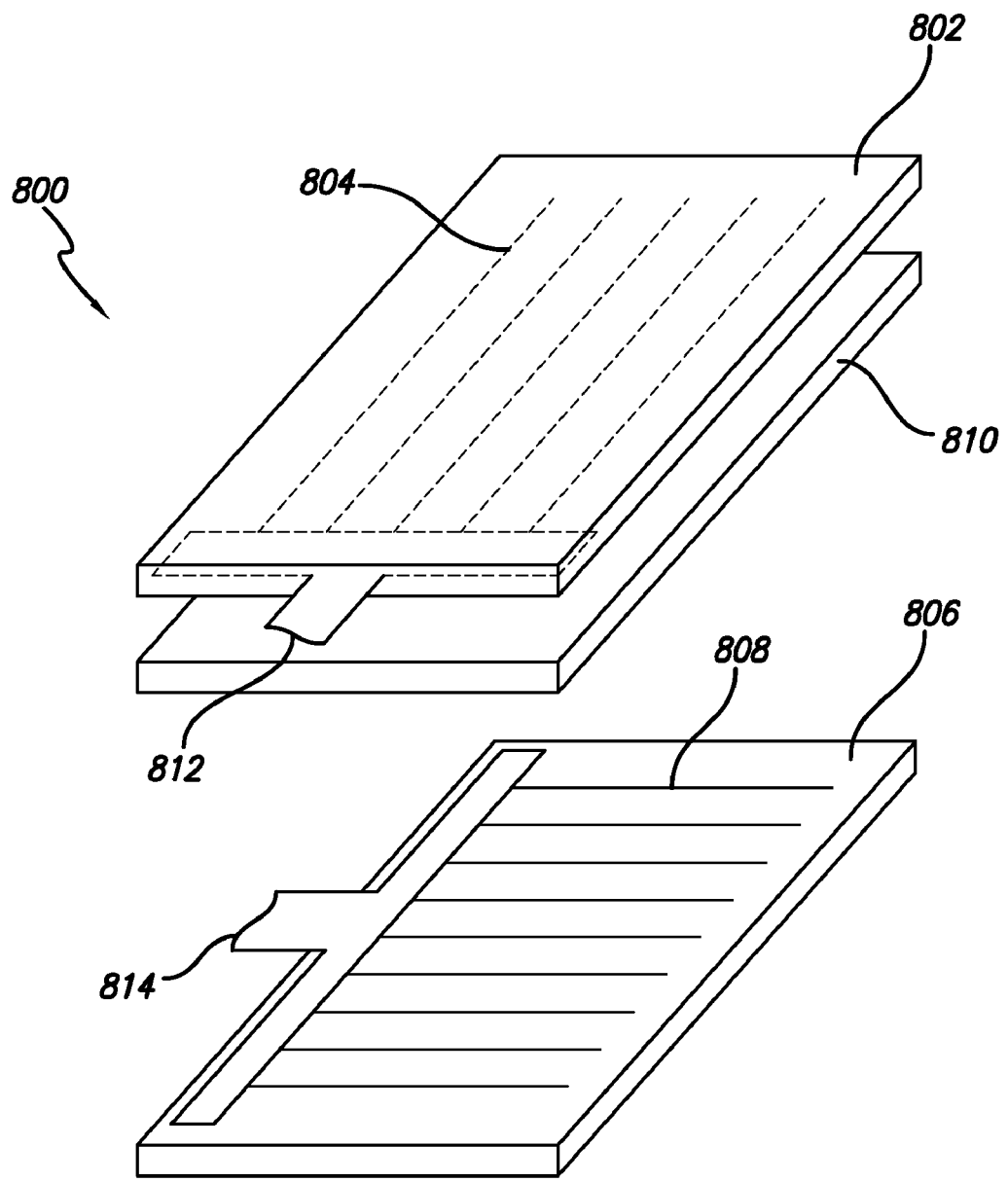
FIG. 8 is an exploded perspective view of an exemplary capacitive touch sensor panel formed from a top layer of glass upon which transparent column traces of ITO have been etched, and a bottom layer of glass upon which row traces of ITO have been etched.

FIG. 8 is an exploded perspective view of an exemplary capacitive touch sensor panel 800 formed from a top layer of glass 802 upon which transparent column traces of ITO 804 have been etched, and a bottom layer of glass 806 upon which row traces of ITO 808 have been etched. The top and bottom glass layers 802 and 806 are separated by a clear polymer spacer 810 that acts as a dielectric between the row and column traces. Because the rows and columns are perpendicular to each other, the most straightforward way to connect to these rows and columns is to bond flex circuit 812 at one edge of the sensor panel, and bond another flex circuit 814 on an adjacent edge of the sensor panel. However, because the connection areas for these flex circuits 812 and 814 are not on the same edge of sensor panel 800 and are not on directly opposing sides of dielectric 810, the sensor panel must be made larger to accommodate these two non-overlapping connection areas.

Capacitive touch sensor panels typically form the row and column traces on two pieces of glass as shown in FIG. 8 because it has not been practical to form column and row traces on either side of a single substrate. Conventional methods for forming ITO traces on one side of a substrate require that the substrate be placed on rollers during the fabrication process. However, if the substrate is then flipped over to form ITO traces on the second side, the rollers will damage any traces previously formed on the first side of the substrate. Furthermore, when etching is used to etch away part of the ITO to form traces on one side of the substrate, the entire substrate is conventionally placed in an etching bath, which will etch away any traces previously formed on the other side of the substrate.

Figure 9:
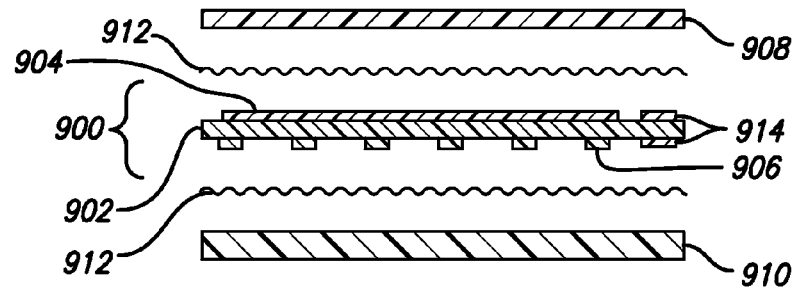
FIG. 9 illustrates an exemplary capacitive touch sensor panel fabricated using a double-sided ITO (DITO) substrate having column and row ITO traces formed on either side of the substrate, and bonded between a cover and an LCD using transparent adhesive according to one embodiment of this invention.

FIG. 9 illustrates an exemplary capacitive touch sensor panel 900 fabricated using a double-sided ITO (DITO) substrate 902 having column and row ITO traces 904 and 906, respectively, formed on either side of the substrate, and bonded between cover 908 and LCD 910 using transparent adhesive 912 according to embodiments of this invention. Substrate 902 can be formed from glass, plastic, hybrid glass/plastic materials, and the like. Cover 908 can be formed from glass, acrylic, sapphire, and the like. To connect to column and row traces 904 and 906, respectively, two flex circuit portions 914 can be bonded to directly opposing sides at the same edge of DITO 902, although other bonding locations may also be employed.

Figure 10:
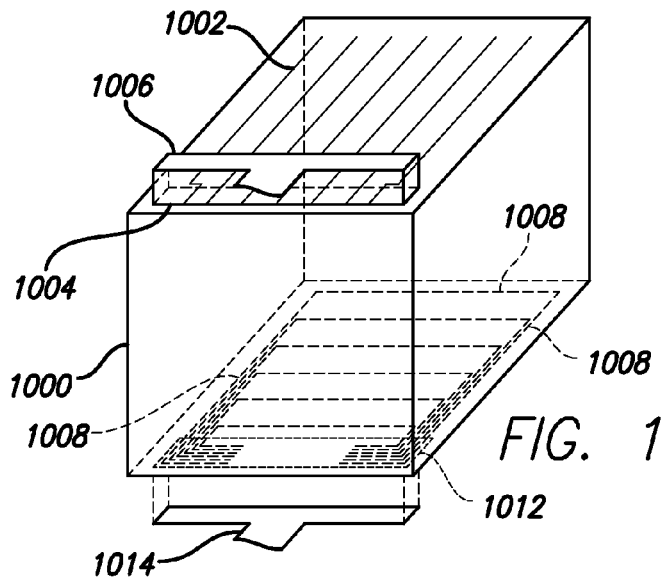
FIG. 10 is an exploded perspective view of an exemplary DITO substrate (with its thickness greatly exaggerated for purposes of illustration only) with columns and rows formed on either side according to one embodiment of this invention.

FIG. 10 is an exploded perspective view of an exemplary DITO substrate 1000 (with its thickness greatly exaggerated for purposes of illustration only) with columns 1002 and rows 1008 formed on either side according to embodiments of this invention. Some of column ITO traces 1002 on the top side are routed to a necked-down connector area 1004, where they are brought off the panel by a flex circuit portion 1006 that can be conductively bonded to the top of DITO substrate 1000. In some embodiments, row ITO traces 1008 on the bottom side can be connected to thin metal traces 1010 that run alongside the edges of the bottom side. Metal traces 1010 can be routed to connector area 1012, which can be directly opposing connector area 1004, or at least on the same edge of DITO substrate 1000 as connector area 1004. Providing connector areas 1004 and 1012 at the same edge of DITO substrate 1000 can allow the substrate and therefore the product to be smaller. Another flex circuit portion 1014 can be used to bring row ITO traces 1008 off the panel.

Column and row ITO traces 1002 and 1008 can be formed on both sides of DITO substrate 1000 using several fabrication methods. In one embodiment, a substrate can be placed on the rollers of the fabrication machinery and a layer of ITO can be sputtered onto a first side of DITO substrate 1000 and etched (e.g. using photolithography techniques) to form column traces 1002. A protective coating of photoresist (e.g. two layers of photoresist) can then be applied over the column traces 1002, and DITO substrate 1000 can be flipped over so that the rollers make contact only with the applied photoresist on the first side and not the formed column traces. Another layer of ITO can then be sputtered onto the now-exposed back side of DITO substrate 1000 and etched to form row traces 1008.

If no metal traces 1010 are required, the photoresist on the first side can be stripped off to complete the process. However, if metal traces 1010 are required at the edges to connect to row traces 1008 and bring them to a particular edge of the substrate, a protective coating of photoresist (e.g. two layers of photoresist) can be applied over row traces 1008, leaving the edges exposed. A metal layer can then be sputtered over the photoresist and exposed edges, and the metal layer can then be etched to form metal traces 1010 at the edges. Finally, all remaining layers of photoresist can be stripped off.

Minor variations to the process described above can also be made. For example, the second side of the DITO substrate patterning may be formed by first patterning a photoresist using very simple geometry to cover only the interior region of the second side of the DITO substrate while leaving the edge regions exposed. For this variation, metal is sputtered first and then the photoresist with simple geometry is then stripped off to leave metal in the edge regions only. Then the ITO is sputtered over the entire second side of the DITO substrate. A second photoresist is applied and patterned to form the mask for the electrode patterns. A series of etching steps is then used to form the electrode pattern in the topmost ITO layer and metal layer underneath. The first etching steps etches the ITO only, and the second etch steps etches the metal layer only which produces the desired electrode geometry.

Figure 13A:
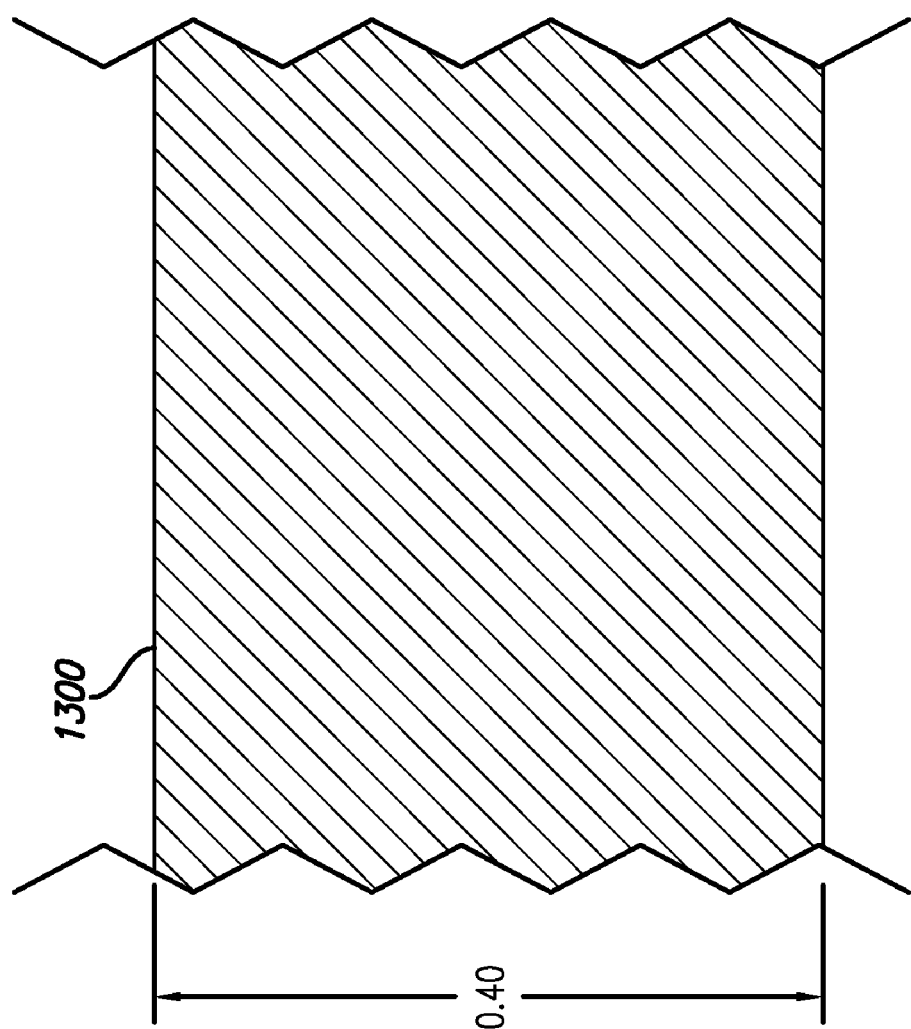
Figure 13C:
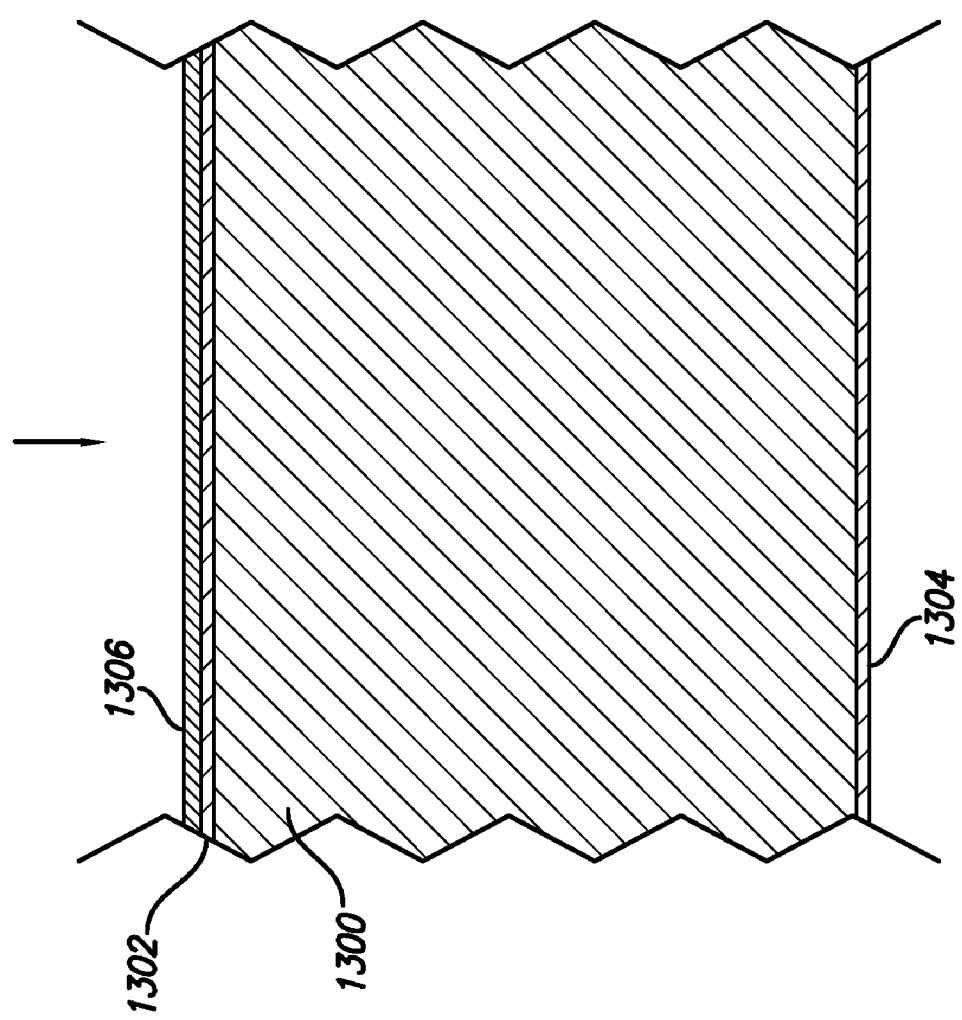
Figure 13D:
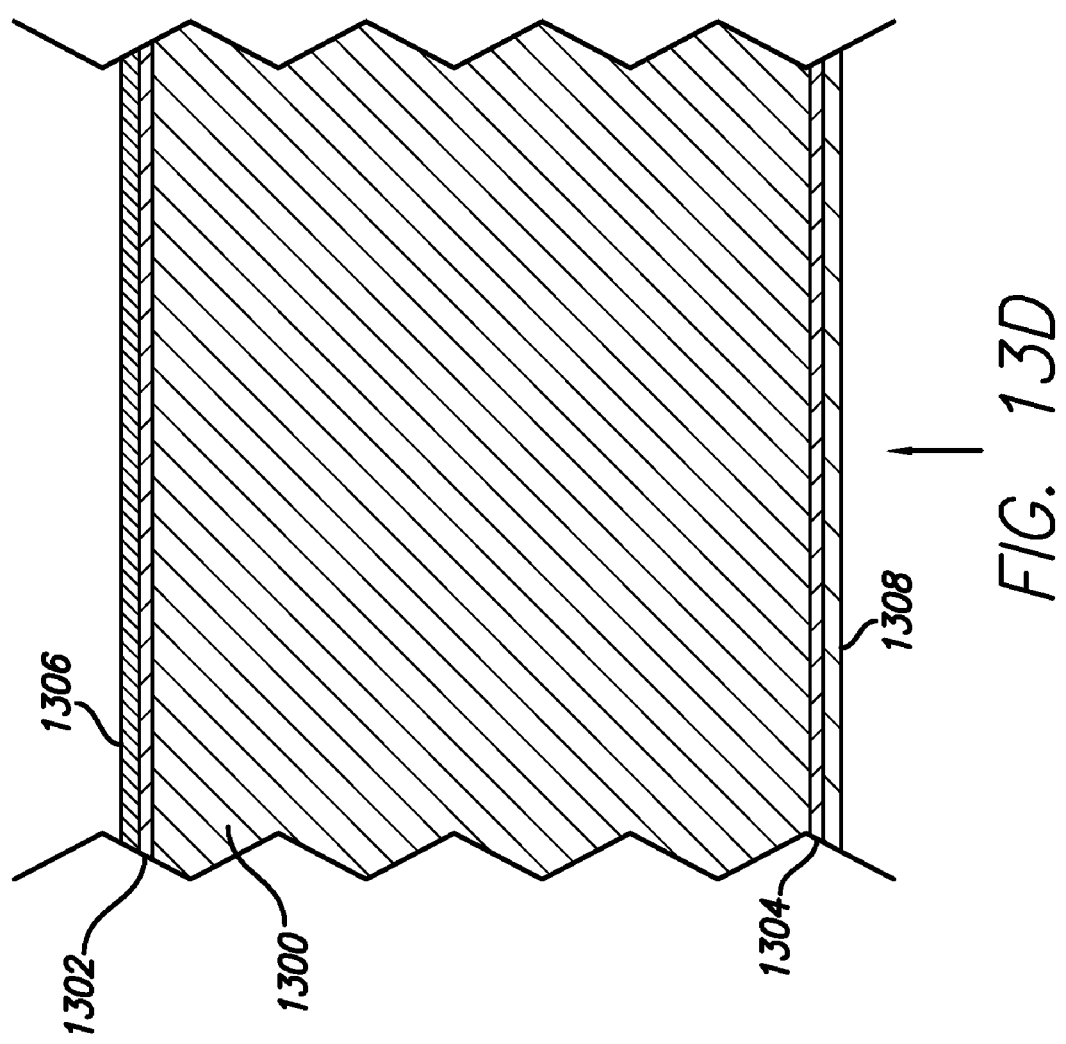
Figure 13E:
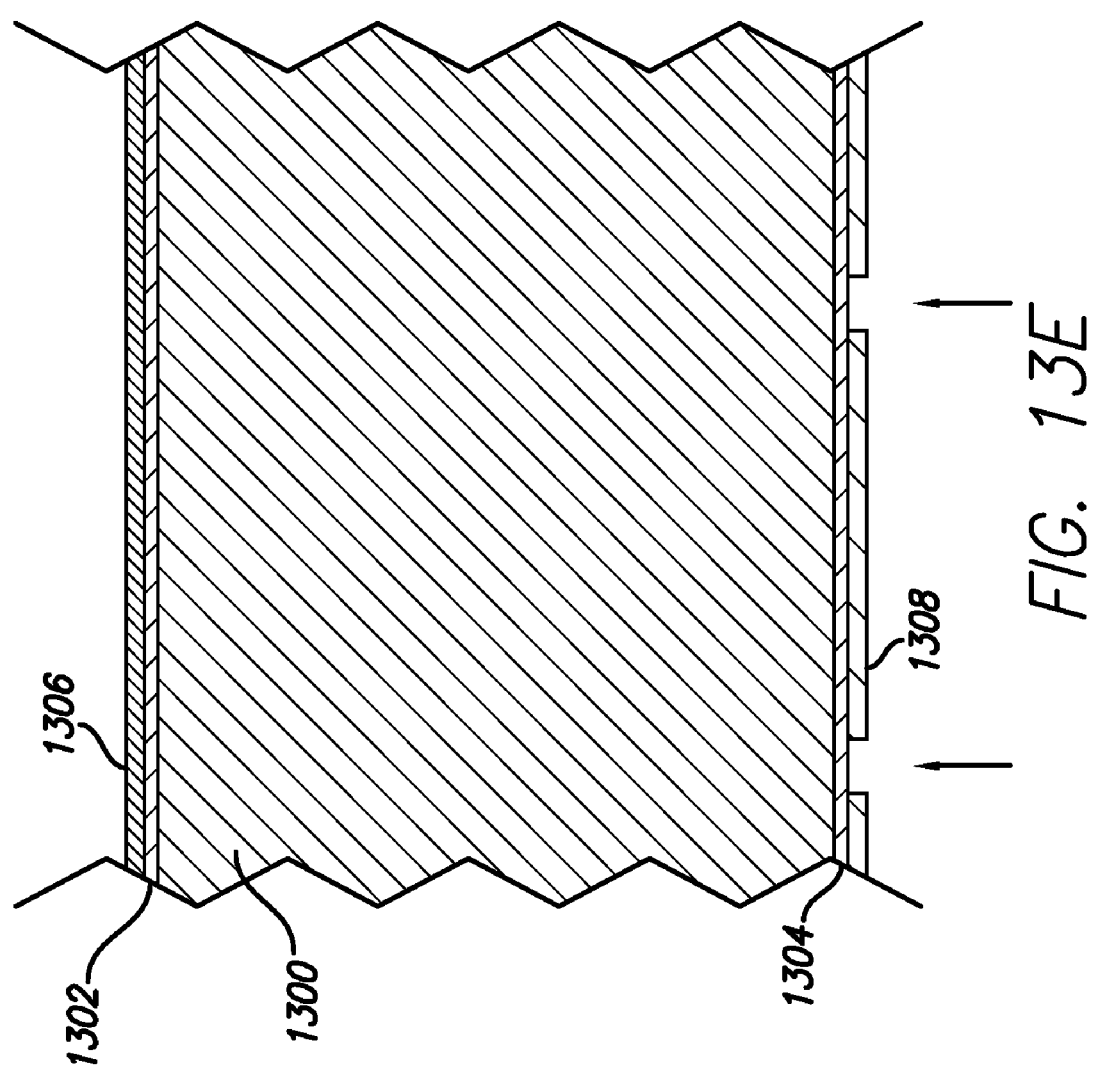
Figure 13F:
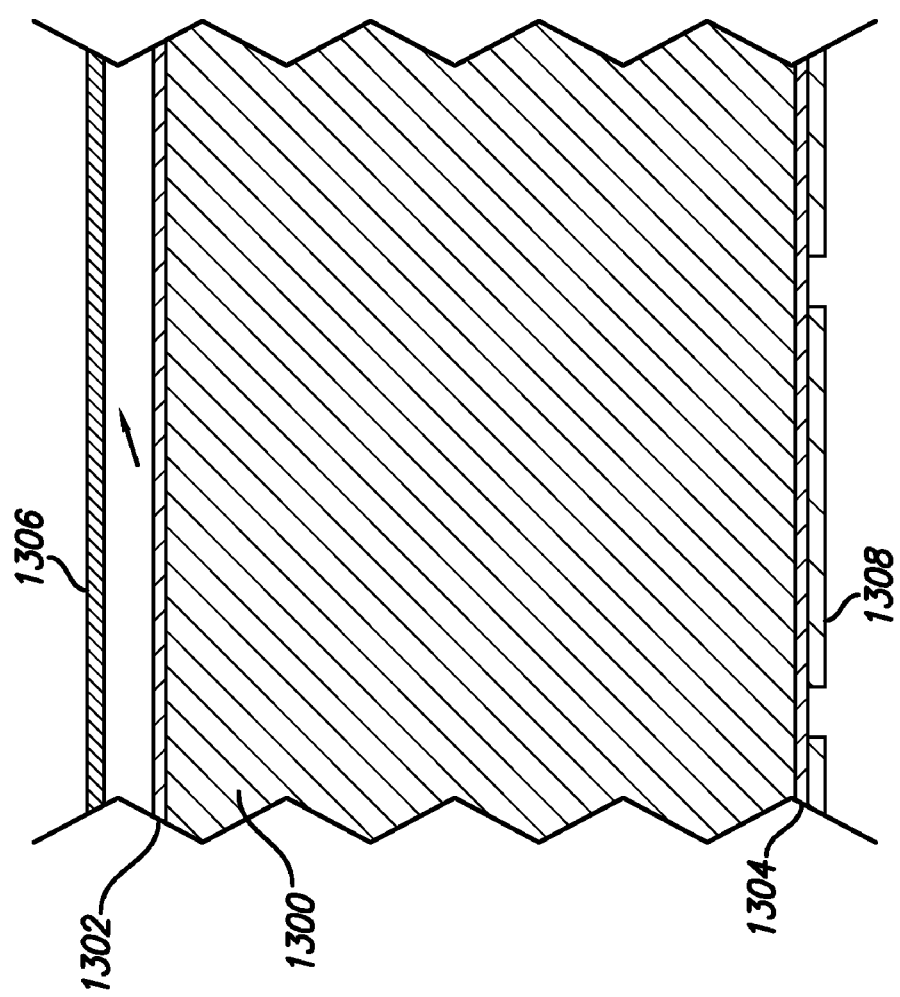
Figure 13G:
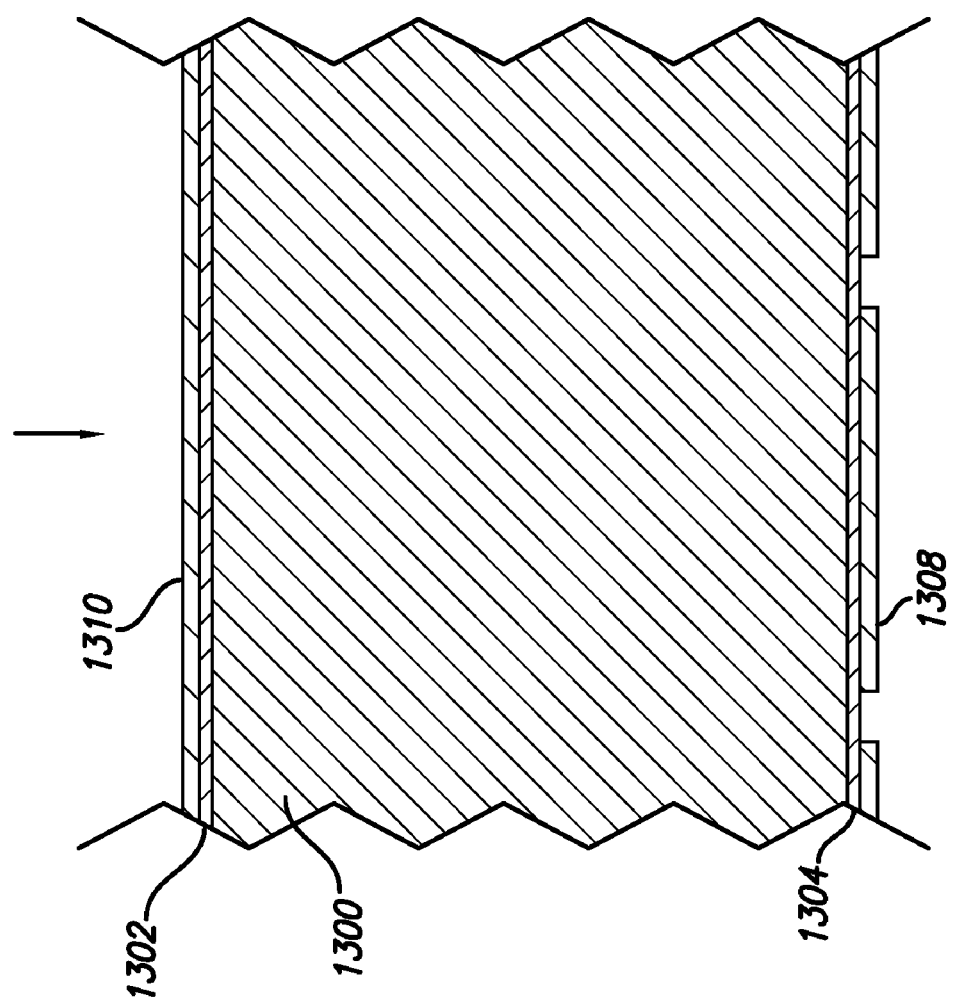
Figure 13H:
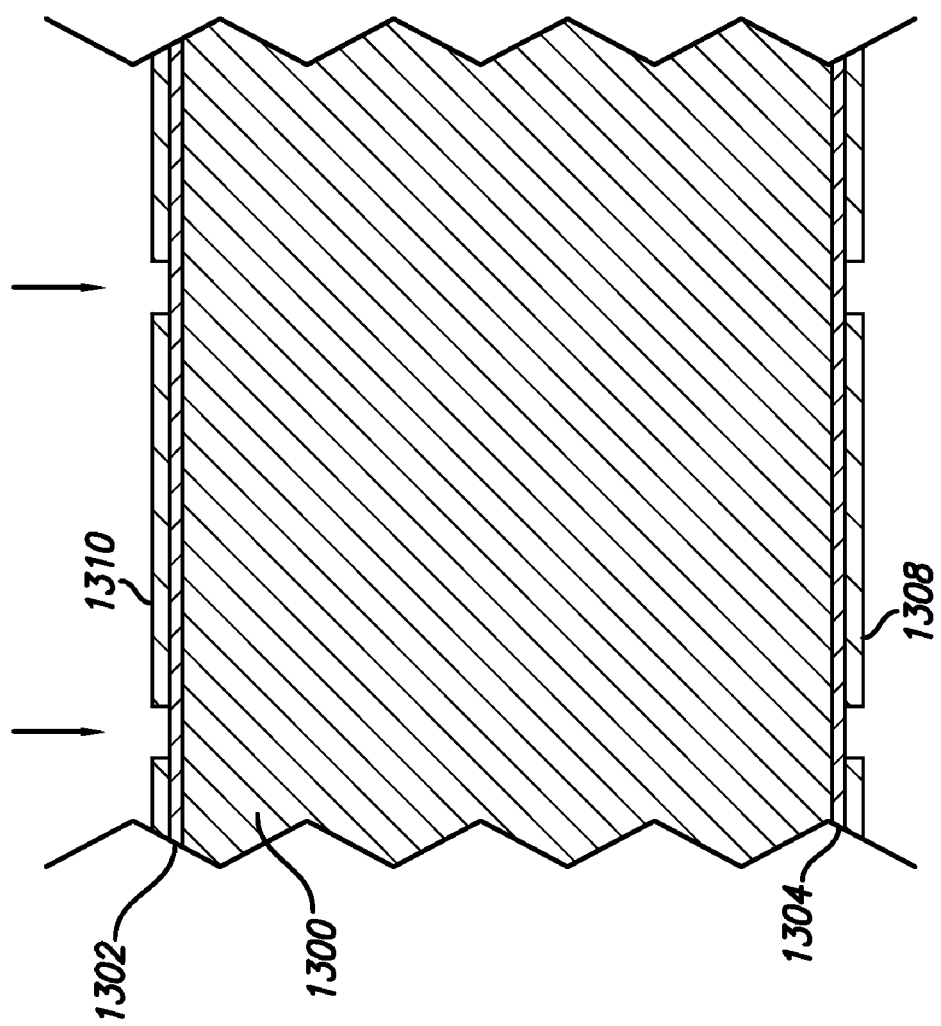
Figure 13I:
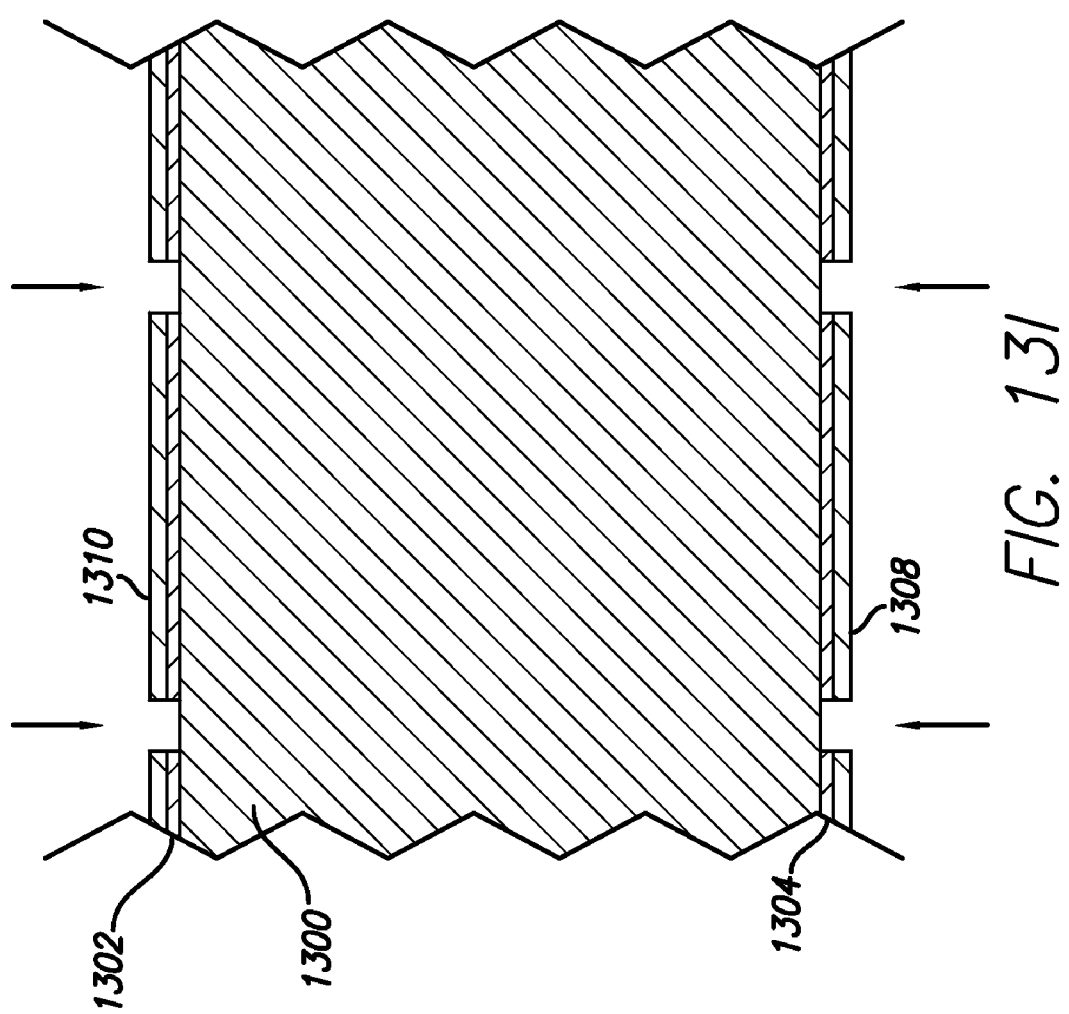
Figure 13J:
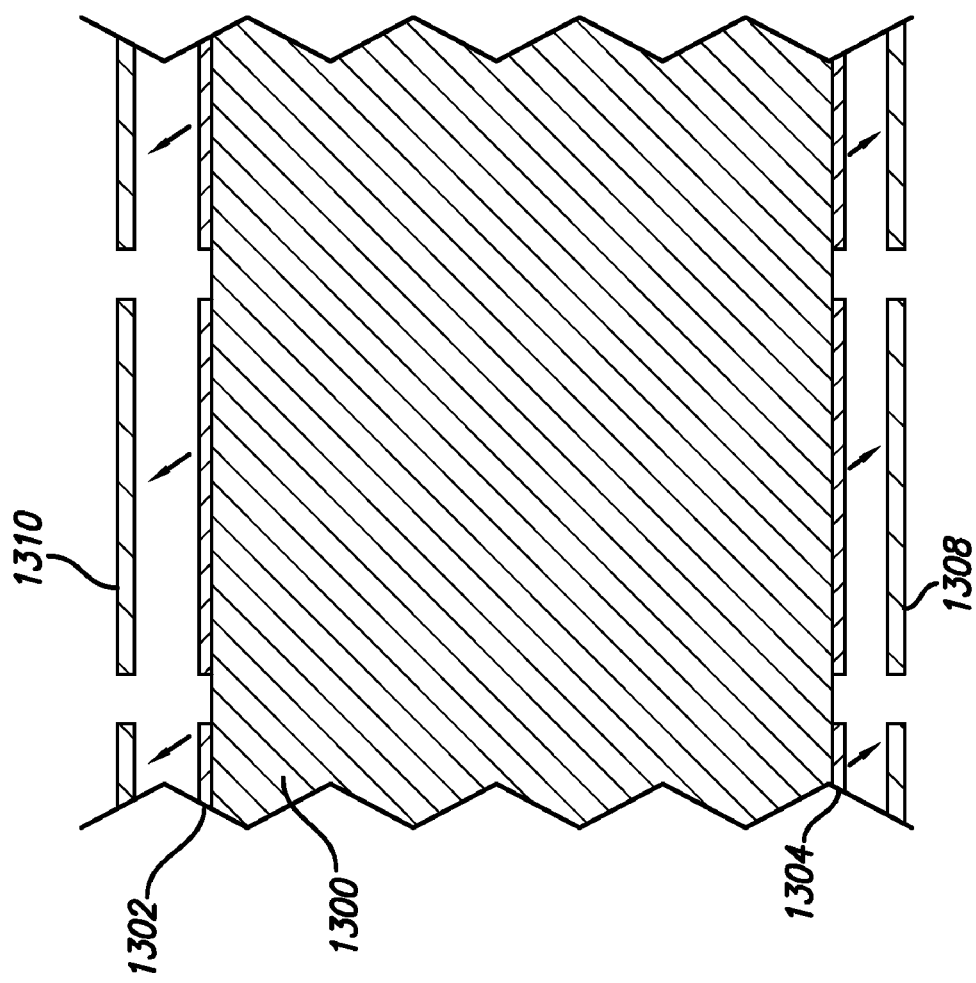
Figure 13L:
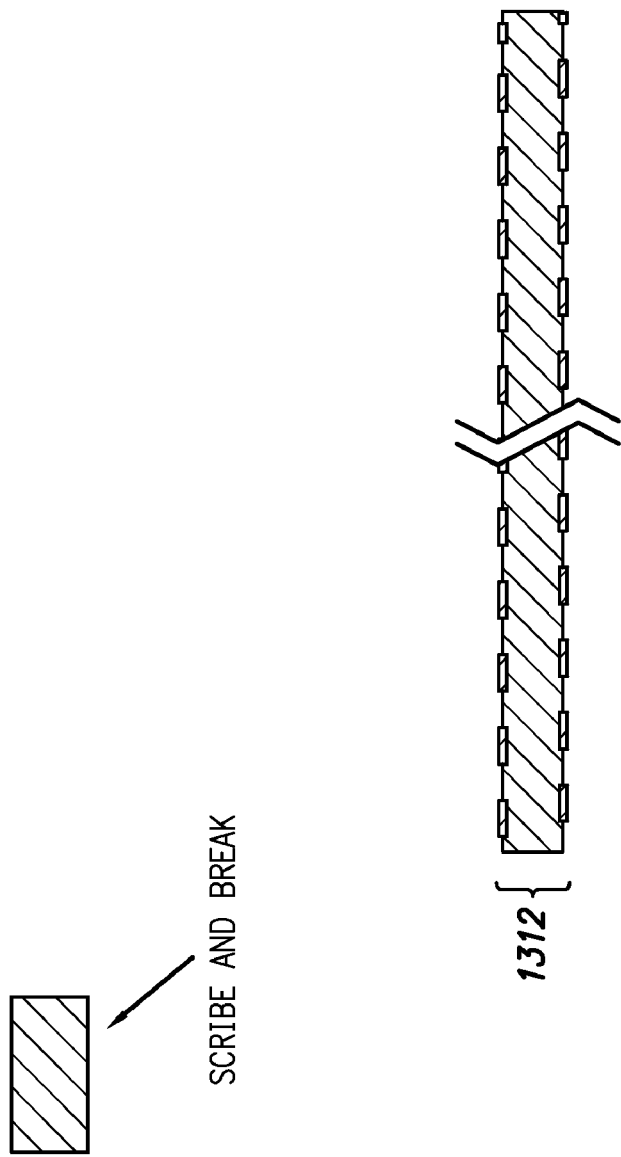
Figure 13M:
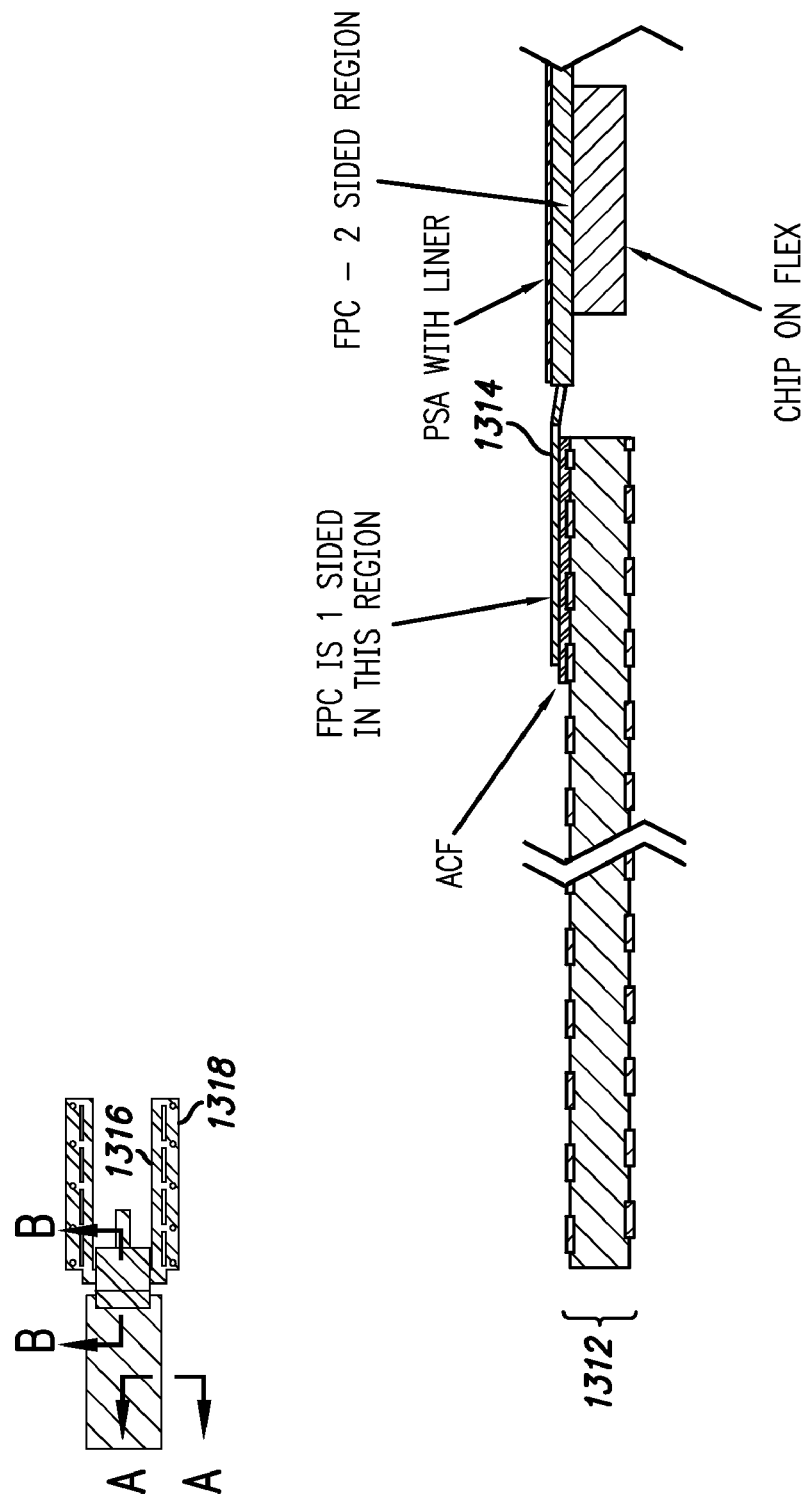
Figure 13N:
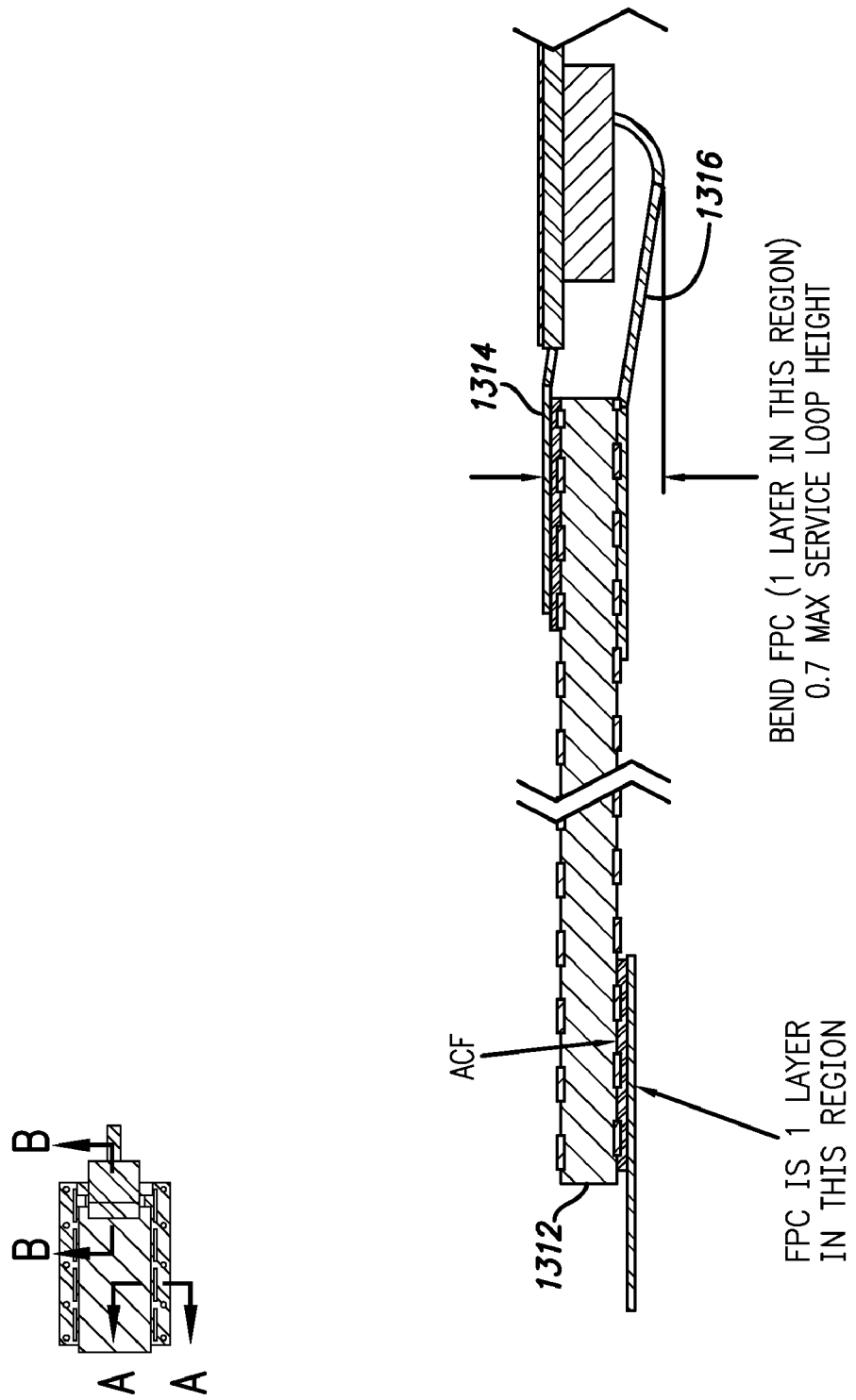
Figure 130:
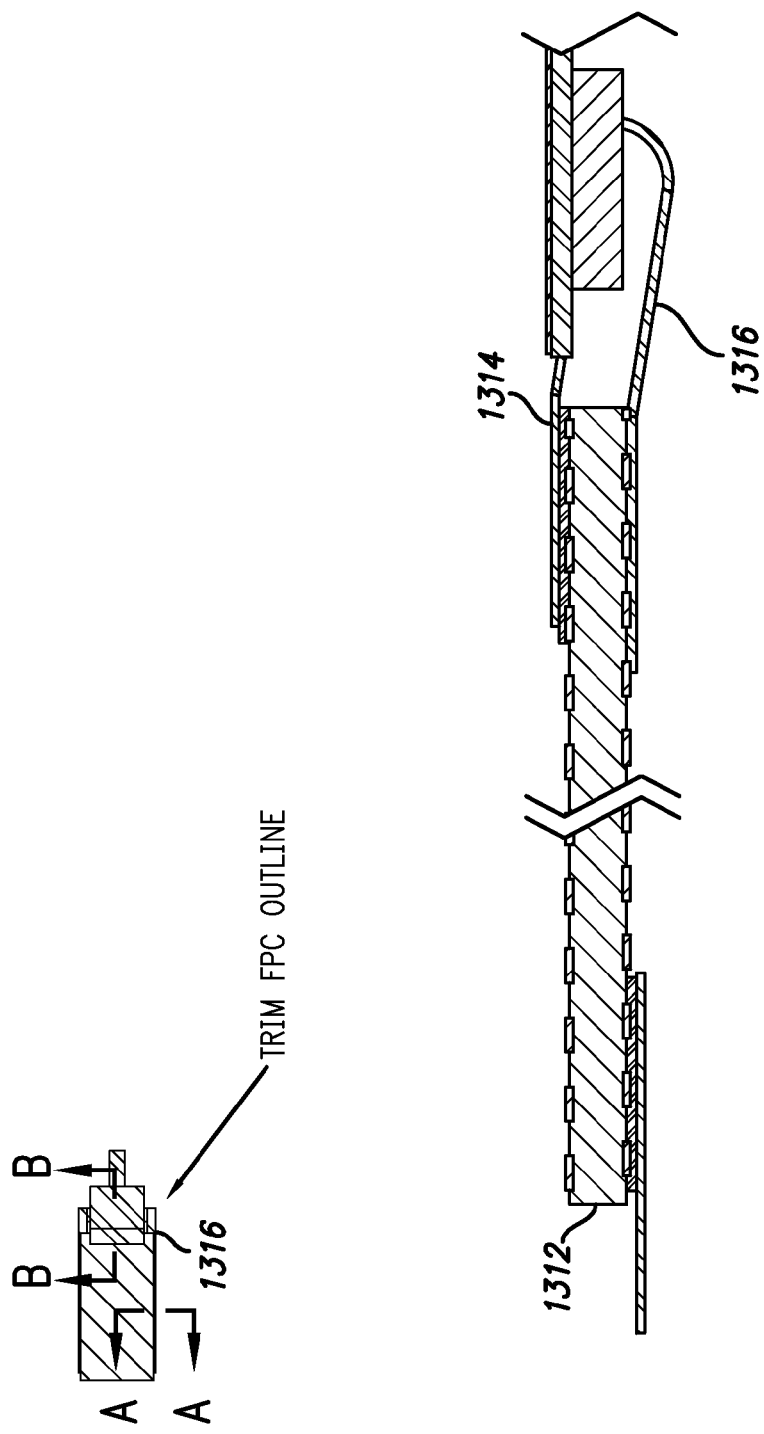
Figure 13P:
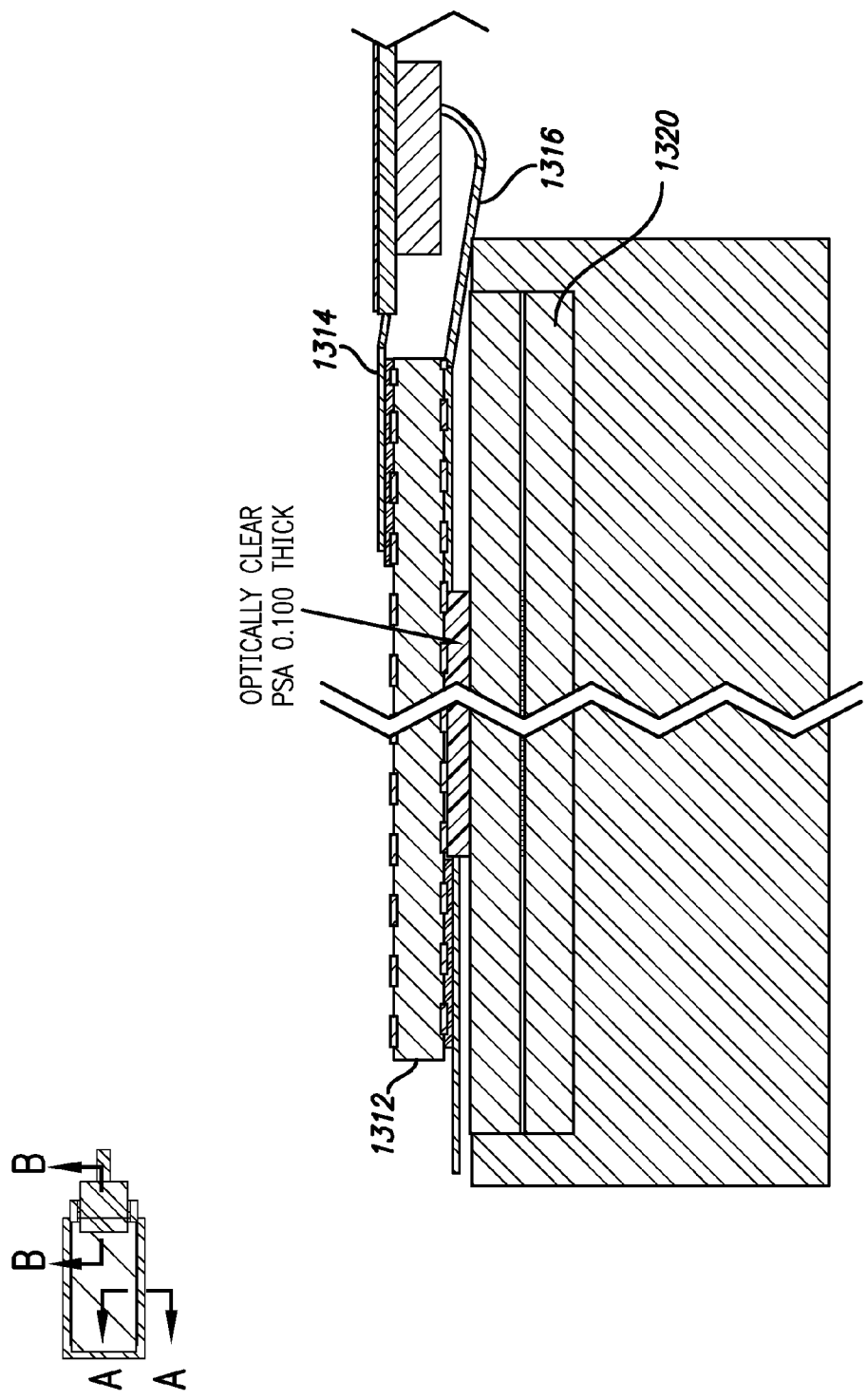
Figure 13Q:
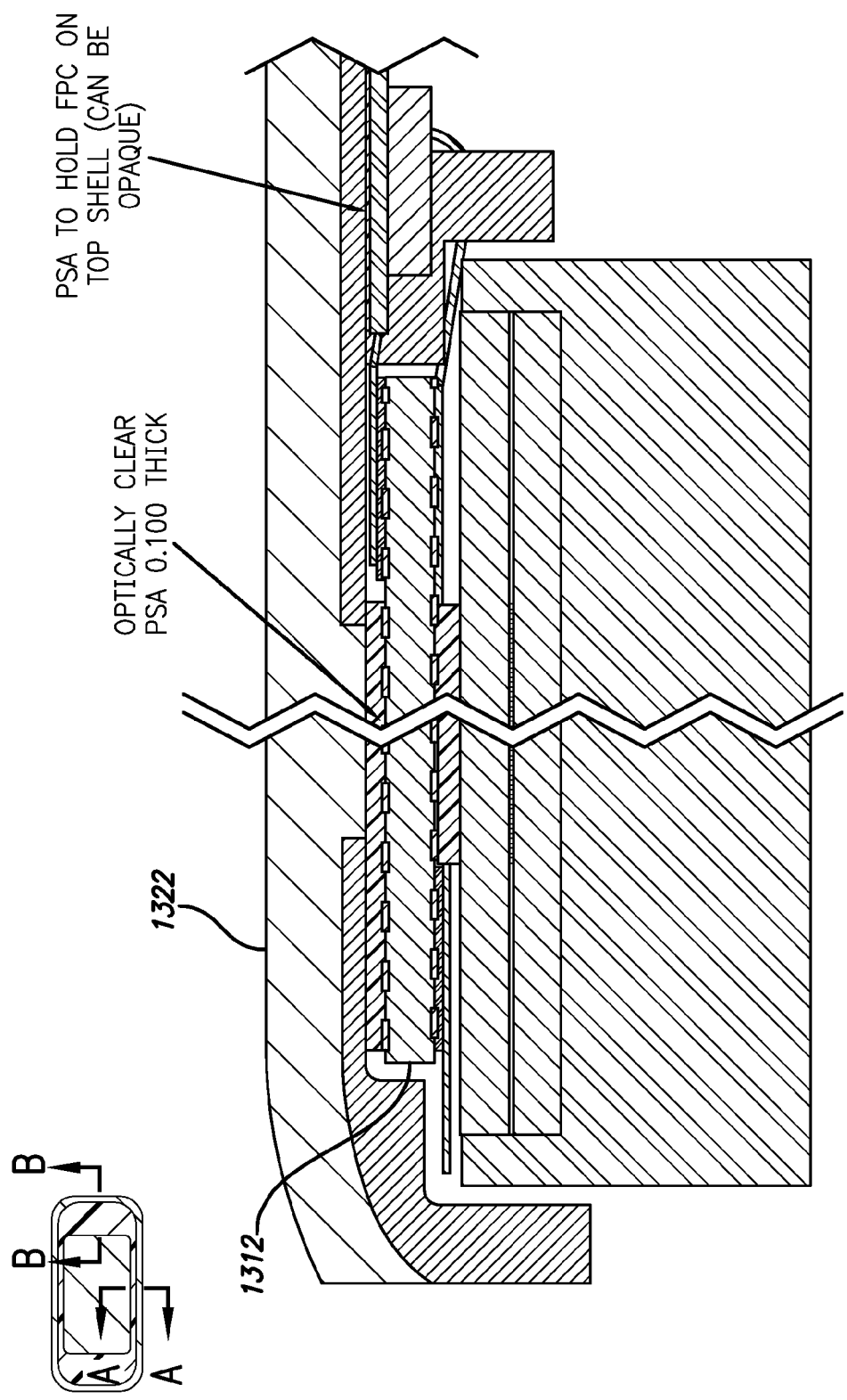
Figure 13R:
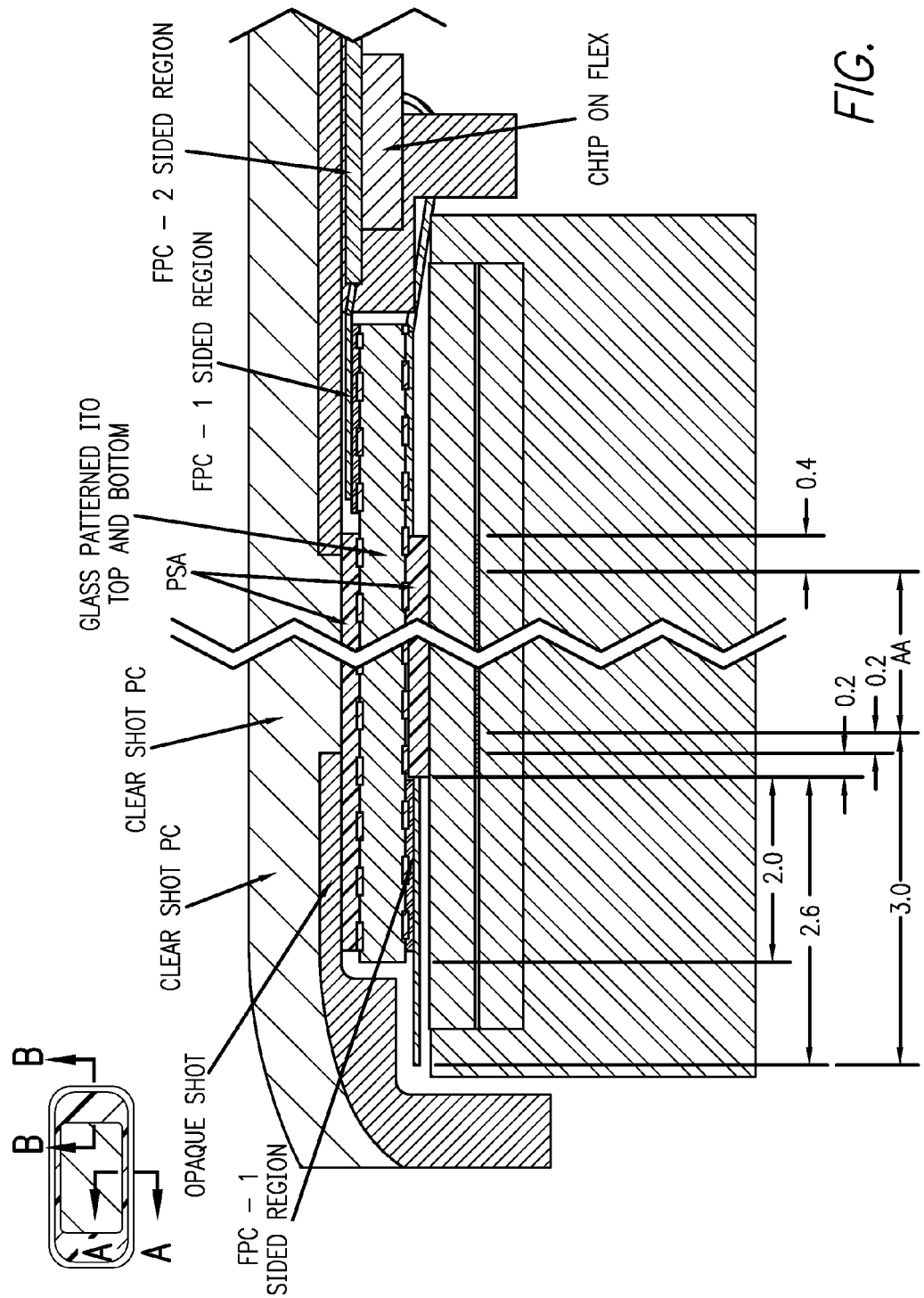

Yet another process for forming column and row ITO traces both sides of a single DITO substrate is illustrated in FIGS. 13a-13r. FIG. 13a shows an initial motherglass (full sheet) 1300, which can be formed from inexpensive soda-lime glass. FIG. 13b shows the application of top ITO 1302 and bottom ITO 1304 on both sides of the glass. The ITO can be sputtered onto glass 1300 at a particular thickness, such as a thickness that generates a resistance of 10 ohms per square. Sputtering of ITO on both sides of the glass can be accomplished by orienting the glass vertically as it passes through a sputtering machine.

FIG. 13c shows the application of a temporary protective film 1306 to protect top ITO 1302 during bottom photoresist processing. Film 1306 can be a photoresist, a removable polymer, plastic liner, and the like. FIG. 13d shows the application of bottom photoresist 1308. FIG. 13e shows the step of patterning and hardening bottom photoresist 1308 using standard photolithography techniques. Note that the steps shown in FIGS. 13d and 13e are performed by placing the stackup upside down onto rollers that come into contact with protective film 1306. FIG. 13f shows the step of removing film 1306. This step is performed with the stackup re-inverted to its as-shown orientation, and accordingly the processing rollers come into contact with photoresist 1308, which protects bottom ITO 1304. FIG. 13g shows the application of top photoresist 1310, and FIG. 13f shows the step of patterning and hardening of top photoresist 1310.

FIG. 13i shows the step of etching top and bottom ITO 1302 and 1304, respectively. This can be accomplished by dipping the entire stackup into an acid bath. FIG. 13j shows the step of stripping top and bottom photoresist 1310 and 1308, respectively. The end result is a sheet of DITO glass 1312, which is then scribed and cut into individual pieces (singulated) as shown in FIG. 13l. Note that in the embodiment of FIG. 13, there is no metal formed on the borders of glass 1300.

FIG. 13m shows the attachment of top flexible printed circuit (FPC) 1314 to DITO glass 1312 using anisotropic conductive film (ACF). Note that the thumbnail top view in the upper left corner of FIG. 13m shows the general shape of the entire FPC assembly, including bottom FPC 1316 and sacrificial strips 1318 with alignment holes. FIG. 13n shows the attachment of bottom FPC 1316 to DITO glass 1312. The thumbnail in FIG. 13n shows bottom FPC 1316 being bent under DITO glass 1312 for attachment. FIG. 13o shows the step of trimming off sacrificial strips 1318.

FIG. 13p shows the step of LCD lamination, where LCD 1320 is shown being bonded to DITO glass 1312 using optically clear pressure sensitive adhesive (PSA) that can be 0.100 thick. FIG. 13q shows the step of cover lamination, where cover 1322 is laminated to DITO glass 1312 using optically clear PSA that can be 0.100 thick. FIG. 13r shows the completed subassembly with added dimensioning.

Figure 11:
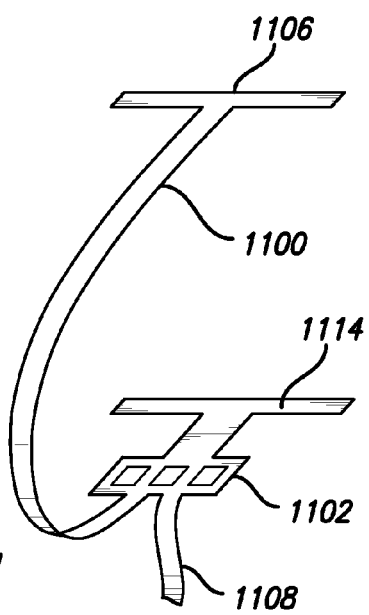
FIG. 11 illustrates an exemplary flex circuit according to one embodiment of this invention, including flex circuit portions for connecting to the row and column traces, respectively, on either side of a DITO substrate, and a flex circuit portion for connecting to a host processor.

FIG. 11 illustrates an exemplary flex circuit 1100 according to embodiments of this invention, including flex circuit portions 1106 and 1114 for connecting to the row and column traces, respectively, on either side of a DITO substrate, and flex circuit portion 1108 for connecting to a host processor. Flex circuit 1100 includes a circuit area 1102 upon which the multi-touch subsystem, multi-touch panel processor, the high voltage driver and decoder circuitry (see FIG. 1), an EEPROM and some essential small components such as bypass capacitors can be mounted and connected to save space. Circuit area 1102 may be shielded by an EMI can (not shown) which encloses circuit area 1102 using top and bottom shield portions. The bottom can may be adhered to a structure of the device to secure the circuit area. From this circuit area 1102, flex circuit 1100 may connect to the top of the DITO substrate via flex circuit portion 1106, to the bottom of the DITO substrate via flex circuit portion 1114, and to a host processor via flex circuit portion 1108.

FIG. 12a illustrates top side 1200 and bottom side 1202 of an exemplary DITO substrate according to embodiments of this invention. Top side 1200 includes isolated ITO squares 1212 between rows 1214, and bottom side 1202 includes wide rows 1216. View 1204 illustrates how outer row trace 1206 is routed to flex connector area 1208 on top side 1200 via trace 1210. View 1218 illustrates how rows 1216 of bottom side 1202 are routed to flex connector areas 1220 via metal traces 1222 running along the long edges of bottom side 1202. Note that flex connector areas 1220 are on the same edge of the DITO substrate as flex connector area 1208, but the conductors themselves are located in non-overlapping areas to make bonding of flex circuits easier.

Figure 12B:
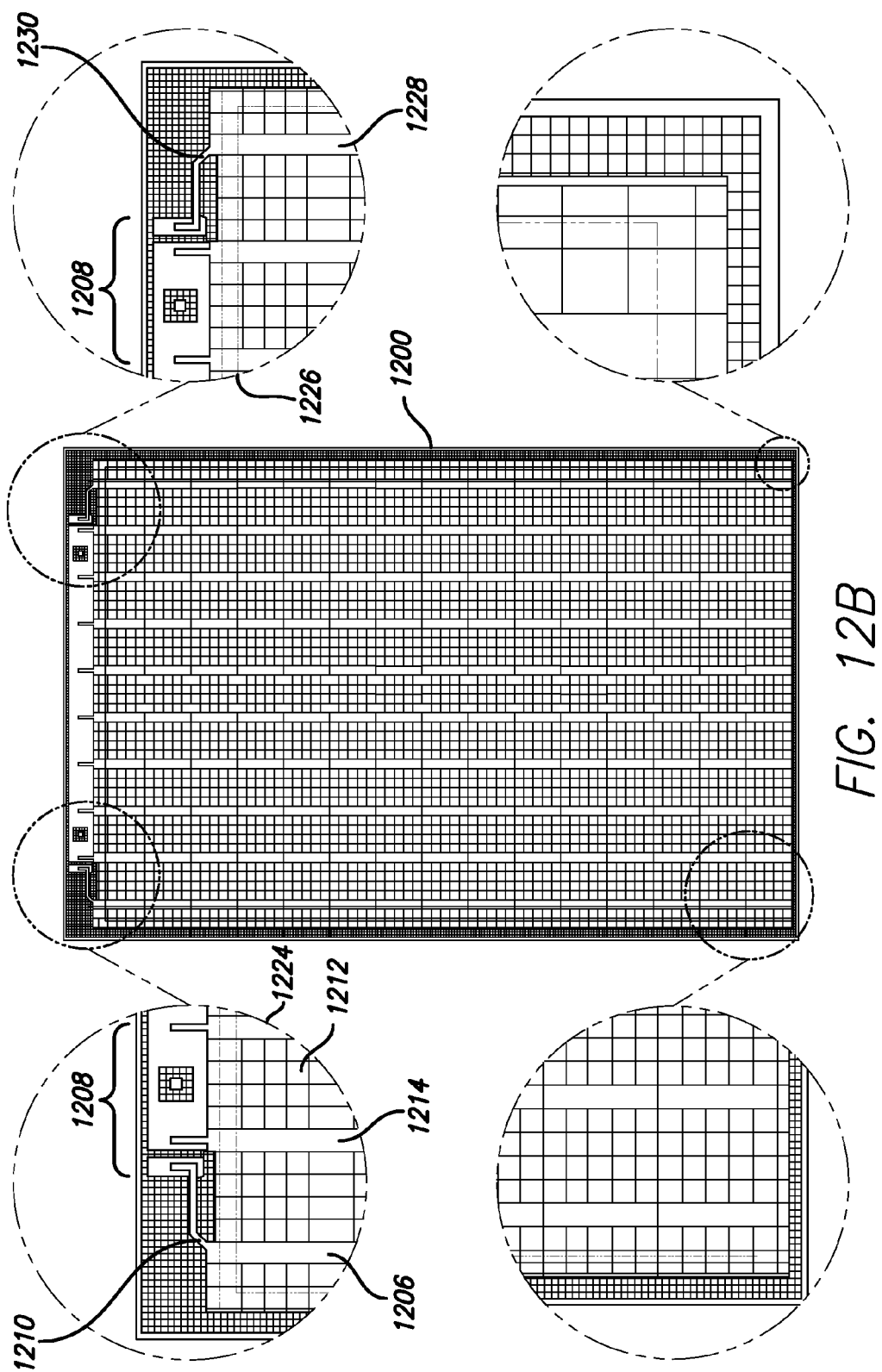
FIG. 12b illustrates isolated ITO squares between rows, and how outer row traces are routed to the flex connector area via traces according to one embodiment of this invention.

FIG. 12b illustrates a more detailed view of top side 1200. View 1224 of top side 1200 shows isolated ITO squares 1212 between rows 1214. Views 1224 and 1226 illustrate how outer row traces 1206 and 1228 are routed to flex connector area 1208 via traces 1210 and 1230, respectively.

Figure 12C:
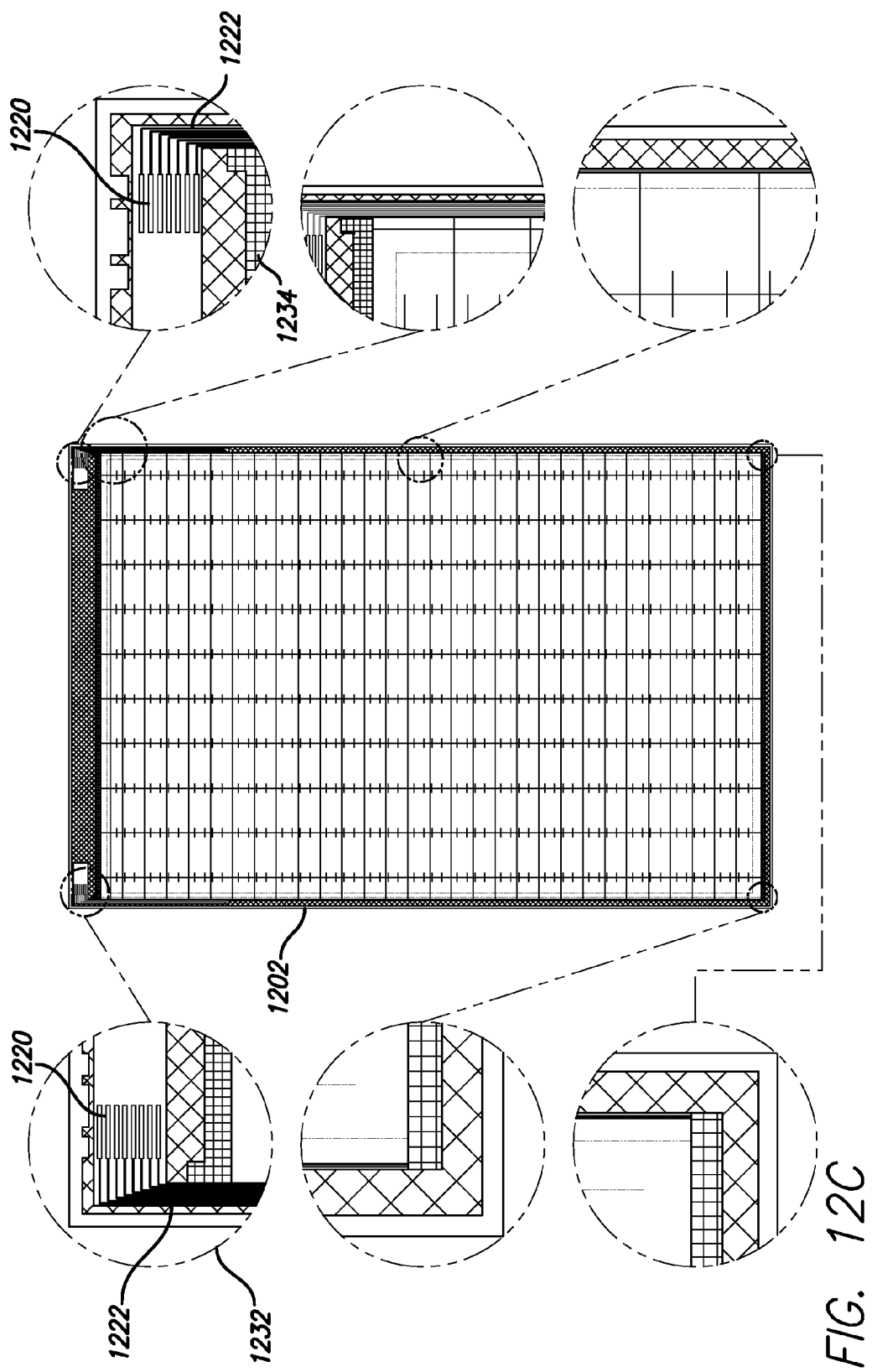
FIG. 12c illustrates how rows are routed to flex connector areas via metal traces running along the long edges of the bottom side according to one embodiment of this invention.

FIG. 12c illustrates a more detailed view of bottom side 1202. Views 1232 and 1234 show how rows are routed to flex connector areas 1220 via metal traces 1222 running along the long edges of bottom side 1202.

Referring again to FIG. 7a illustrates an exemplary mobile telephone 736 that can include capacitive touch sensor panel 724 and flex circuit 734 capable of connecting to both sides of the substrate according to embodiments of this invention. Sensor panel 724 can be fabricated using a substrate having column and row ITO traces formed on either side of the substrate, and metal traces form along the edges of one side of the substrate to allow flex circuit connection areas to be located on opposing sides of the same edge of the substrate. FIG. 7b illustrates an exemplary digital audio/video player 738 that can include capacitive touch sensor panel 724 and flex circuit 734 capable of connecting to both sides of the substrate according to embodiments of this invention. Sensor panel 724 can be fabricated using a substrate having column and row ITO traces formed on either side of the substrate, and metal traces form along the edges of one side of the substrate to allow flex circuit connection areas to be located on opposing sides of the same edge of the substrate. The mobile telephone and digital audio/video player of FIGS. 7a and 7b can advantageously benefit from sensor panel 724 because a single, thinner, smaller-sized sensor panel can be used. The overall effect is reduced product size and manufacturing costs.

Although the present invention has been fully described in connection with embodiments thereof with reference to the accompanying drawings, it is to be noted that various changes and modifications will become apparent to those skilled in the art. Such changes and modifications are to be understood as being included within the scope of the present invention as defined by the appended claims.

What is claimed is:

1. A method for fabricating a capacitive touch sensor panel, comprising:
    depositing a layer of conductive material on a first side of a dielectric substrate and etching the conductive material to form a first set of non-overlapping traces along a first dimension of a two-dimensional coordinate system;
    depositing a protective coating of photoresist over the first set of traces on the first side of the substrate;
    reversing an orientation of the substrate with respect to fabrication machinery;
    depositing a layer of conductive material on a second side of the dielectric substrate and etching the conductive material to form a second set of non-overlapping traces along a second dimension of the two-dimensional coordinate system; and
    removing the photoresist on the first side of the substrate.

2. The method of claim 1, further comprising, prior to removing the photoresist on the first side of the substrate:
    depositing a protective coating of photoresist over the second set of traces on the second side of the substrate while leaving edges of the second side of the substrate exposed;
    depositing a metal layer over the exposed edges of the second side and etching the metal layer to form metal traces that connect to the second set of traces; and
    removing the photoresist on the first and second sides of the substrate.

3. A method for fabricating a capacitive touch sensor panel, comprising:
    sputtering conductive material on first and second sides of a dielectric substrate;
    applying a temporary protective film over the conductive material sputtered onto the first side of the substrate;
    depositing a protective coating of photoresist over the conductive material sputtered onto the second side of the substrate, and patterning the photoresist;
    reversing an orientation of the substrate with respect to fabrication machinery;
    removing the temporary protective film from the first side of the substrate;
    depositing a protective coating of photoresist over the conductive material sputtered onto the first side of the substrate, and patterning the photoresist;
    etching the conductive material on the first and second sides of the substrate; and
    stripping off the photoresist on the first and second sides of the substrate.

4. The method of claim 1, wherein the depositing of the layer of the conductive material on the second side of the dielectric substrate and etching the conductive material to form the set of non-overlapping traces further comprises:
    applying a first photoresist to an interior region of the second side while leaving edge regions exposed, depositing a metal layer, and stripping off the first photoresist to leave the metal in the edge regions;
    depositing the layer of conductive material on the second side;
    applying and patterning a second photoresist on the second side to form a mask for the set of non-overlapping traces; and
    etching the layer of conductive material and metal layer to form the set of non-overlapping traces.

* * * * *